United States Patent
Hirose et al.

(10) Patent No.: US 8,151,173 B2
(45) Date of Patent: Apr. 3, 2012

(54) SEMICONDUCTOR STORAGE DEVICE COMPRISING MEMORY ARRAY INCLUDING NORMAL ARRAY AND PARITY ARRAY

(75) Inventors: Masanobu Hirose, Kyoto (JP); Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 898 days.

(21) Appl. No.: 12/193,326

(22) Filed: Aug. 18, 2008

(65) Prior Publication Data

US 2009/0089646 A1    Apr. 2, 2009

(30) Foreign Application Priority Data

Oct. 2, 2007   (JP) ................. 2007-258436

(51) Int. Cl.
*H03M 13/00* (2006.01)

(52) U.S. Cl. .............. 714/785; 714/763; 365/185.09
(58) Field of Classification Search ............. 714/763, 714/785; 365/185.09
See application file for complete search history.

(56) References Cited

U.S. PATENT DOCUMENTS

| 4,710,934 | A | 12/1987 | Traynor |
| 5,384,789 | A | 1/1995 | Tomita |
| 6,851,081 | B2 | 2/2005 | Yamamoto |
| 7,237,175 | B2 | 6/2007 | Hatakenaka et al. |
| 7,278,085 | B1 * | 10/2007 | Weng et al. ............. 714/766 |
| 7,315,970 | B2 | 1/2008 | Arakawa et al. |
| 7,539,926 | B1 * | 5/2009 | Lesea ................. 714/776 |
| 7,640,483 | B2 * | 12/2009 | Ariyama .............. 714/769 |
| 7,644,348 | B2 * | 1/2010 | Longwell et al. ....... 714/800 |
| 7,653,861 | B2 * | 1/2010 | Kanai et al. ............ 714/758 |
| 7,729,157 | B2 * | 6/2010 | Hoya .................. 365/145 |
| 7,765,455 | B2 * | 7/2010 | Hoya et al. ............ 714/763 |
| 7,779,333 | B2 * | 8/2010 | Taito et al. ............ 714/763 |
| 2007/0038919 | A1 | 2/2007 | Sekiguchi et al. |

FOREIGN PATENT DOCUMENTS

JP    62-248198 A    10/1987

* cited by examiner

*Primary Examiner* — Esaw Abraham
(74) *Attorney, Agent, or Firm* — McDermott Will & Emery LLP

(57) ABSTRACT

Data latches, multiplexers, an ECC circuit section, and an input/output circuit section are arranged in columns and adjacent to each other, in an extending direction of data lines that are formed in a direction orthogonal to word lines. A layout of a data path system is formed in bit slices. Further, parity bits are equally distributed so as to cause delay times of bits to be uniform.

29 Claims, 16 Drawing Sheets

SEMICONDUCTOR STORAGE DEVICE COMPRISING MEMORY ARRAY INCLUDING NORMAL ARRAY AND PARITY ARRAY

BACKGROUND OF THE INVENTION

1. Field of the Invention

The present invention relates to a semiconductor storage device, and more particularly, to a semiconductor storage device comprising an Error Checking and Correcting (ECC) circuit.

2. Description of the Related Art

In recent years, as semiconductor manufacturing techniques have been advanced, devices have been increasingly miniaturized. For example, the packaging density of a semiconductor storage device, such as representatively a dynamic random access memory (hereinafter referred to as a DRAM) or a static random access memory (hereinafter referred to as an SRAM), has been improved.

A redundant relief technique is generally known in which a defective memory cell is replaced with a spare memory cell in order to improve the yield of a DRAM or an SRAM. However, the redundant relief technique cannot overcome a defect occurring due to a deterioration in characteristics of an element during use or a defect occurring due to a soft error by an alpha ray or a cosmic ray, which are involved with miniaturization of elements, such as memory cells, sense amplifiers and the like. Such a problem with reliability is solved by a known self-correction technique using an ECC circuit.

Although a system is conventionally implemented on a plurality of chips, the increase of packaging density due to miniaturization has led to an increase in demand for System-On-Chips (SOCs) where a DRAM or an SRAM and a logic circuit or a CPU are provided together on a single chip. SOCs are characterized in that the width of a bus for a memory provided thereof can be relatively arbitrarily set, and a considerably wide bus arrangement (e.g., 256 bits) can be used for a general-purpose discrete memory. By using such a wide bus arrangement, performance can be significantly improved, such as a significant improvement in a data transfer rate between a CPU and a memory, or the like.

For example, U.S. Pat. No. 5,384,789 discloses a semiconductor storage device with an ECC function which comprises a set of cell arrays and sense amplifiers, several blocks of data bus amplifiers and data write amplifiers, a syndrome generating circuit, and an error correcting circuit, wherein each block has a syndrome decoding circuit for decoding a syndrome generated by the syndrome generating circuit, thereby reducing the number of wiring lines. U.S. Pat. No. 7,237,175 discloses an example in which a plurality of ECC circuits are used to perform error checking and correction and data is arranged so as not to be adjacent to each other in ECC processing units, thereby avoiding a multi-bit error during occurrence of a soft error.

US Patent Application Publication No. 2007/0038919 discloses an example in which an ECC process is performed using a large bit width, wherein an ECC circuit is provided adjacent to a sense amplifier array of a DRAM, which is effective to a multi-bit process.

Japanese Patent Application Publication No. S62-248198 discloses an example in which vertical and horizontal parity codes are used to control selection switching of a horizontal group and a vertical group so that each of a plurality of physically neighboring memory cells and check cells that are grouped in units corresponding to the number of bits included in the horizontal group or the vertical group does not belong to the same horizontal group or the same vertical group, whereby horizontal group parity check and vertical group parity check can be achieved using a totally similar circuit arrangement.

SUMMARY OF THE INVENTION

According to U.S. Pat. No. 5,384,789, the syndrome generating circuit, the syndrome decoding circuit, and the error correcting circuit are provided in common to each block and are arranged at separate positions, so that if the bit width of the ECC process increases, the wiring region increases, leading to an increase in layout area, and also, the wiring length increases, leading to an increase in process time. According to U.S. Pat. No. 7,237,175, three check bits are required for 4-bit normal data, and therefore, it is apparent that the proportion of check bits is large and the chip size significantly increases. Conversely, when the bit width of the ECC process increases, the proportion of check bits decreases, but the number of wiring lines between a memory array and an ECC process circuit increases, leading to an increase in chip area. Further, the wiring line between the memory array and the ECC process circuit increases and the wiring length between bits is likely to be unbalanced, leading to a decrease in the performance of the ECC process. These conventional techniques all have a problem with a multi-bit ECC process, such as an increase in chip size or a decrease in ECC process performance.

On the other hand, US Patent Application Publication No. 2007/0038919 discloses an example in which an ECC process with a large bit width is performed, wherein an ECC circuit is provided adjacent to a sense amplifier array of a DRAM. This example is effective to a multi-bit process, but an ECC process circuit is required for each sense amplifier array. Therefore, in a DRAM having a large number of sense amplifier arrays within a memory array, the chip area significantly increases.

Japanese Patent Application Publication No. S62-248198 discloses an example in which horizontal and vertical parity codes are used, wherein error detecting circuits are connected in cascade. It is not practically possible to apply this example to a recent miniaturization process with a low voltage. Although parity cells are distributed and arranged in this example, normal cells and parity cells cannot be arranged in equal pitches. Therefore, when this example is applied to an ECC process with Hamming codes, the arrangement of parity bits is non-uniform, so that the process performance is non-uniform. As a result, the process performance is determined by bits that provide a low level of process performance.

In view of the above-described problems, the present invention has been achieved. An object of the present invention is to provide a semiconductor storage device with an ECC function that can suppress an increase in chip area due to the provision of parity cells and improve the ECC process performance, and further can maintain the yield and the reliability while reducing the chip area.

According to an aspect of the present invention, a semiconductor storage device comprises a memory array including a normal array for storing normal data and a parity array for storing parity data for detecting an error in the normal data, a plurality of first data lines for writing and reading the memory array, a plurality of first data latches to which the plurality of first data lines are connected, an ECC circuit section for generating parity data to be stored into the parity array from write data to the normal array, and performing error detection/correction with respect to read data based on normal data and parity data read from the plurality of first data latches, an input/output section for interfacing between the ECC circuit section and an outside, a plurality of second data lines to which outputs of the plurality of first data latches are connected, and a plurality of third data lines to which data that has been error-corrected by the ECC circuit section is connected. The plurality of second data lines are input to the ECC circuit section. The plurality of third data lines output from the ECC circuit section are connected to the input/output section. The plurality of first data latches are arranged in a column, close to the memory array in an extending direction of the plurality of first data lines. The ECC circuit section is arranged close to the plurality of first data latches. The plurality of first data latches and the ECC circuit section are provided substantially within a width in which the plurality of first data lines are provided. Data the number of which is up to the number of bit lines can be read from or written to the memory array without increasing the area of the memory array section, and multi-bit data can be simultaneously subjected to an ECC process. Thereby, the proportion of the parity array can be reduced.

Generally, in the case of an ECC process in which a 1-bit error correction is performed using Hamming codes, the minimum number of parity bits required is 5 bits for 16 normal bits, 6 bits for 32 normal bits, 7 bits for 64 normal bits, 8 bits for 128 normal bits, 9 bits for 256 bits, . . . , and so on. According to this relationship, the proportion of parity bits decreases with an increase in the number of ECC process bits, resulting in a reduction in area.

Further, an ECC process circuit and an interface circuit may be provided on an extension of the data line with respect to the memory array. In this case, a data path from the outside of the semiconductor storage device to the memory array can be caused to be shortest, so that a reduction in speed performance due to an ECC process can be suppressed to a minimum level.

On the other hand, if the number of ECC process bits is increased, the number of parity bits can be reduced, but the number of logical gate stages required for the ECC process section increases, so that the ECC process speed decreases. There is a trade-off relationship between the area reducing effect and the speed reduction involved with the number of ECC process bits. The speed reduction may lead to a failure of system implementation.

The semiconductor storage device may further comprise a plurality of first multiplexers for performing multiplexing in accordance with a first address signal and a plurality of fourth data lines connected to outputs of the plurality of first multiplexers. The plurality of first data lines are input to the plurality of first multiplexers. The plurality of fourth data lines are connected to the plurality of first data latches. The plurality of first multiplexers are provided in a column between the memory array and the plurality of first data latches. Thereby, ECC process bits can be arranged that satisfies the speed performance and are suitable for a reduction in area.

The plurality of first data lines corresponding to the plurality of fourth data lines to be simultaneously selected may be arranged so as not to be physically adjacent to each other. Thereby, even if a defect occurs in the plurality of first data lines physically adjacent to each other, the defect can be corrected by an ECC process.

The semiconductor storage device may further comprise a plurality of second multiplexers for performing multiplexing in accordance with a second address signal and a plurality of fifth data lines connected to outputs of the plurality of second multiplexers. The plurality of fifth data lines are connected to the ECC circuit section. The plurality of third data lines are connected to the input/output section. Thereby, the flexibility for satisfying the trade-off relationship between the speed performance and a reduction in the number of parity bits is improved, resulting in a more optimal ECC configuration.

The semiconductor storage device may further comprise a plurality of first multiplexers for performing multiplexing in accordance with a first address signal and a plurality of fourth data lines connected to outputs of the plurality of first multiplexers. The plurality of second data lines are input to the plurality of first multiplexers. The plurality of fourth data lines are connected to the ECC circuit section. The plurality of first multiplexers are arranged in a column between the plurality of first data latches and the ECC circuit section. Thereby, ECC process bits can be arranged that satisfies the speed performance and are suitable for a reduction in area. Further, a page mode operation of a DRAM can be achieved and the page length can be set to be long.

The plurality of second data lines and the plurality of first data lines corresponding to the plurality of fourth data lines to be simultaneously selected may be arranged so as not to be physically adjacent to each other. Thereby, even if a defect occurs in adjacent bits in the plurality of second data lines or the first latches as well as the plurality of first data lines, the defect can be corrected by an ECC process.

The semiconductor storage device may further comprise a plurality of second multiplexers for performing multiplexing in accordance with a second address signal and a plurality of fifth data lines connected to outputs of the plurality of second multiplexers. The plurality of fifth data lines are connected to the ECC circuit section. The plurality of third data lines are connected to the input/output section. Thereby, the flexibility for satisfying the trade-off relationship between the speed performance and a reduction in the number of parity bits is improved, resulting in a more optimal ECC configuration.

The semiconductor storage device may further comprise a plurality of second data latches for selectively latching the plurality of third data lines and externally input data. Thereby, even if the data bit width of an ECC process is different from the data bit width of an external terminal or even if a semiconductor storage device has a byte access function, then when data that has been read out from the memory array and has been subjected to an ECC process is latched by the second data latch, and the data of the second data latch is selectively rewritten with externally input write data, parity data can be generated.

A layout pattern of circuits corresponding to a unit bit that is 1-bit data input to the ECC circuit section may be the same and continuous between each unit bit, in a region corresponding to the normal array and a region corresponding to the parity array between the memory array and the ECC circuit section. Thereby, a considerably dense layout pattern corresponding to the memory array is required or a sense amplifier circuit or a bus amplifier circuit is provided, so that variations in elements can be suppressed by providing a uniform layout pattern. Thus, normal bits and parity bits can be effectively caused to have uniform characteristics.

The plurality of first data latches include at least a read latch circuit, a write buffer circuit and a data line precharging circuit connected to the plurality of first data lines. Thereby, a specific non-volatile rewritable memory configuration, such as a DRAM, an SRAM, a flash memory or the like, can be achieved.

The plurality of first data lines may be bit lines connected to memory cells in the memory array. The read latch circuit may have a sense amplification function of detecting and amplifying a potential of the bit line. Thereby, the semiconductor storage device has an effective configuration that can be applied to an SRAM, a flash memory or the like. The sense amplification function and the data latch function are implemented by a common element, thereby making it possible to reduce the number of circuit elements.

The plurality of first data lines may be common data lines selectively connected to a plurality of sense amplifiers in the memory array via data line connection switches. The read latch circuit may have a bus amplification function of detecting and amplifying a potential of the common data line. Thereby, the semiconductor storage device has a function that is effective to a DRAM. The bus amplification function and the data latch function are implemented by a common element, thereby making it possible to reduce the number of circuit elements.

The sense amplifier may be connected to a complementary bit line connected in common to a plurality of dynamic memory cells. Data to be simultaneously subjected to an ECC process may be arranged, corresponding to the complementary bit lines that are not physically adjacent to each other. Thereby, even if a short-circuit of adjacent bit lines in a DRAM or a block defect lying on a plurality of memory cells is present, error correction can be performed by ECC.

Latch control signal lines of the plurality of first data latches may be provided in a first wiring layer in a direction parallel to a plurality of word line shunt wiring lines in the memory array. The plurality of first data lines, the plurality of second data lines, and the plurality of third data lines may be provided in a second wiring layer in a direction orthogonal to the word line shunt wiring line. Thereby, the wiring layers and wiring directions of the data path sections including the memory array section and the ECC circuit section can be caused to be uniform, so that the wiring length of the data path can be caused to be shortest, resulting in a reduction in layout area.

The memory array may be divided into a plurality of sub-memory arrays including the normal array and the parity array. The plurality of sub-memory arrays may be arranged in constant pitches. Thereby, the parity arrays can be uniformly distributed within the memory array, thereby making it possible to cause write and read characteristics between each parity bit to be uniform.

In each of sub-word regions separated by word line shunt regions, n (n is an integer of one or more) of the sub-memory arrays may be included. The sub-word regions may be arranged in constant pitches. Thereby, the sub-word regions have the same array arrangement, so that characteristics during word line access can be caused to be uniform.

In the sub-word region, the parity array may be arranged close to the word line shunt region. Thereby, an access penalty with respect to parity bits can be suppressed.

The ECC circuit section may include a syndrome generating section for receiving the plurality of first data lines from normal data and parity data read from the memory array, and generating syndrome data, an error detecting section for decoding the input syndrome data and detecting the presence or absence of an error, and an error bit, an error correcting section for correcting the normal data using output data of the error detecting section, and a parity generating section for generating parity data from externally input write data. The syndrome generating section, the error detecting section, the error correcting section, and the parity generating section may be successively arranged in a direction away from the memory array. Thereby, a block arrangement can be achieved in which a data path can be reduced in the ECC circuit section.

Input pins of the syndrome generating section may be arranged on extensions of the plurality of first data lines. The extensions may have a shortest distance. Thereby, the first data lines input to the respective bits of the ECC circuit section can be caused to be shortest, so that a data delay can be minimized and the layout area can be reduced.

Unit circuits of the error detecting section and unit circuits of the error correcting section each corresponding to a unit bit that is data input to the syndrome generating section, may be arranged in an extending direction of the plurality of first data lines. Thereby, the pitches in which the unit circuits are arranged in the error detecting section and the error correcting section can be caused to match the ECC process bits, so that the data path in the ECC circuit section can be caused to be shortest.

Output signal pins of the syndrome generating section may be arranged in a vicinity of a middle of the syndrome generating section, and may have substantially uniform wiring lengths with respect to the error detecting section. Thereby, process times required for generation of syndrome bits can be caused to be uniform, and the loads of the generated syndrome bits can be caused to be uniform.

The semiconductor storage device may comprise at least the memory array section, the plurality of first data latches, and the ECC circuit section. Power supply lines or ground lines may be arranged in a grid as a whole. Thereby, the resistances of the power supply lines and the ground lines can be caused to be reduced and uniform, so that the stability of a circuit operation can be improved.

A semiconductor storage device according to another aspect of the present invention comprises a memory array including a normal array for storing normal data and a parity array for storing parity data for detecting an error in the normal data, a plurality of first data lines for writing and reading the memory array, a plurality of first data latches to which the plurality of first data lines are connected, an ECC circuit section for generating parity data to be stored into the parity array from write data to the normal array, and performing error detection/correction with respect to read data based on normal data and parity data read from the plurality of first data latches, an input/output section for interfacing between the ECC circuit section and an outside, a plurality of second data lines to which outputs of the plurality of first data latches are connected, and a plurality of third data lines to which data that has been error-corrected by the ECC circuit section is connected. The plurality of second data lines are input to the ECC circuit section. The plurality of third data lines output from the ECC circuit section are connected to the input/output section. The plurality of first data latches are arranged in a column, close to the memory array in an extending direction of the plurality of first data lines. The ECC circuit section is arranged close to the plurality of first data latches. The plurality of first data latches and the ECC circuit section constitute a plurality of memory blocks provided substantially within a width in which the plurality of first data lines are provided. The plurality of memory blocks are operated in parallel in the same address cycle. Thereby, an ECC process of a larger number of bits can be achieved while suppressing a reduction in speed performance to a minimum level. Also, the efficiency of error correction can be improved without an area penalty.

The number of the plurality of memory blocks may be at least two. The plurality of memory blocks may be arranged in a column in an extending direction of a word line. The word lines of the plurality of memory blocks may be connected in common and may be driven by a common word line driver. Thereby, the memory blocks can be continuously arranged and a word line driver can be shared, resulting in a reduction in layout area.

The plurality of memory blocks may have the same circuit and layout configurations. Thereby, the access performance of the memory blocks can be caused to be uniform, so that the efficiency of layout design can be improved.

A semiconductor storage device according to another aspect of the present invention comprises a memory array including a normal array for storing normal data and a parity array for storing parity data for detecting an error in the normal data, a plurality of first data lines for writing and reading the memory array, a plurality of first data latches to which the plurality of first data lines are connected, an ECC circuit section for generating parity data to be stored into the parity array from write data to the normal array using a Hamming code technique, and performing error detection/correction with respect to read data based on normal data and parity data read from the plurality of first data latches, and a multiplexing section for reducing the number of the plurality of first data lines by a factor of 1/n (n is a natural number of one or more). A spare bit line for redundancy is not provided. Thereby, in a semiconductor storage device without an ECC function and with a column redundancy function, the efficiency of defect relieve is increased and the yield is improved. Also, in a semiconductor storage device with both an ECC function and a column redundancy function, a spare bit line for redundancy is not required, so that a significant area reducing effect can be obtained.

The semiconductor storage device may comprise a spare word line for redundancy and a row redundancy determining and row redundancy switching circuit. Thereby, redundant relief can be performed with respect to a word line defect that cannot be error-corrected by an ECC process, resulting in an increase in yield.

The present invention is a technique that is applicable and effective to a semiconductor storage device with an ECC function, particularly one that has a multi-bit data configuration. The ECC process performance can be improved while suppressing an increase in chip area due to the provision of parity cells. Further, by the ECC circuit technique of the present invention, the yield and reliability can be secured without a column redundancy function, so that the chip area can be effectively reduced.

DETAILED DESCRIPTION OF THE PREFERRED EMBODIMENTS

Hereinafter, semiconductor storage devices according to embodiments of the present invention will be described with reference to the accompanying drawings.

Embodiment 1

Figure 1:
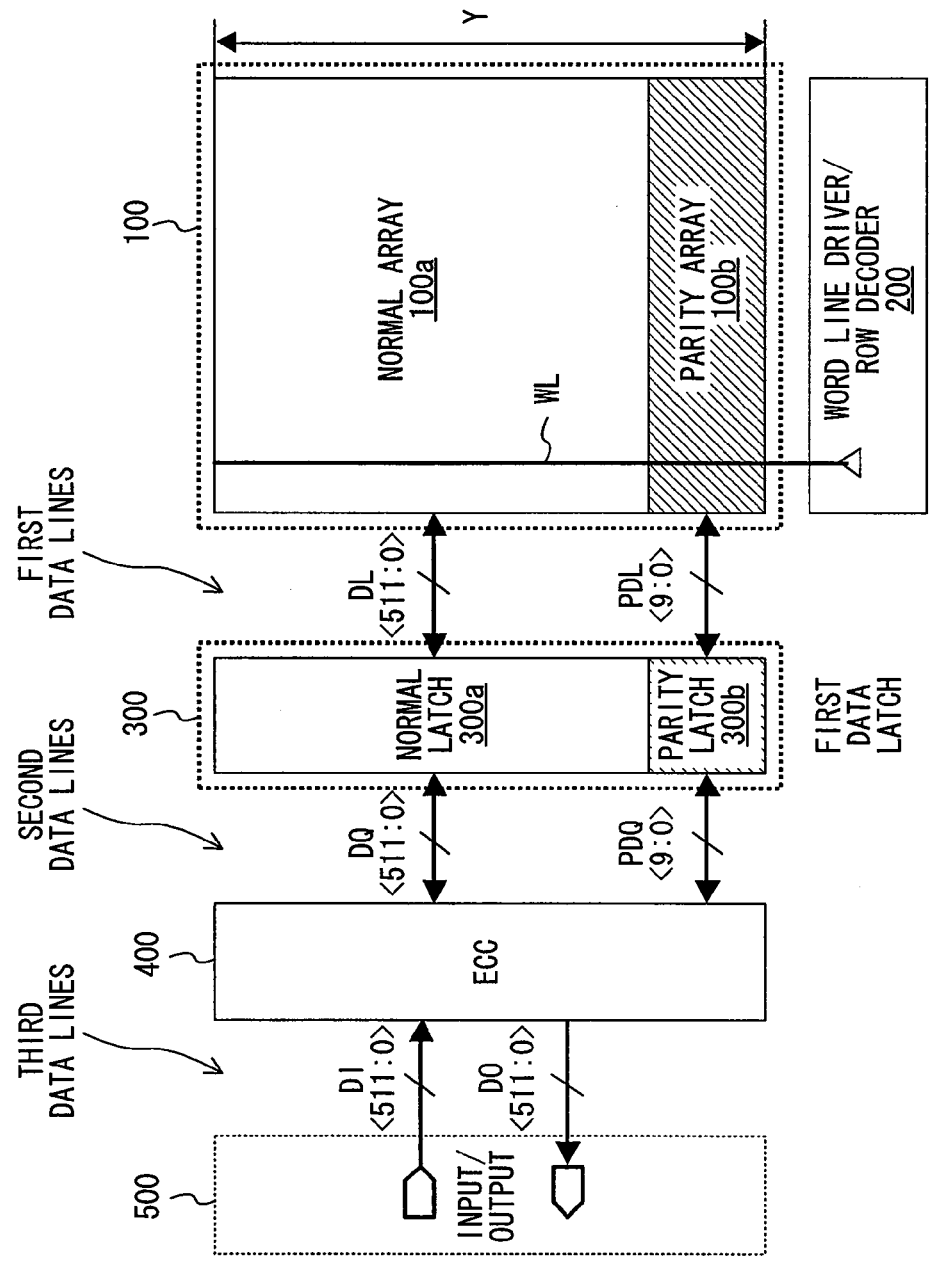
FIG. 1 is a block diagram showing a configuration of a semiconductor storage device according to Embodiment 1 of the present invention.

FIG. 1 is a diagram schematically showing a configuration of a semiconductor storage device with an ECC circuit according to Embodiment 1 of the present invention, which is a representative example where the present invention is applied to a DRAM. The following description mainly focuses on a data read path.

A memory array 100 includes a normal array 100a for storing normal data and a parity array 100b for storing check data for performing error detection in the normal array. Although not illustrated in detail, the normal array 100a and the parity array 100b each include identical memory cells arranged in a matrix. Word lines WL are selected and driven in accordance with an address signal by a word line driver/row decoder 200. The normal array 100a and the parity array 100b are selected by common word lines WL, and data of memory cells is read out onto a plurality of bit lines. The data read out onto the bit lines is detected and amplified by sense amplifiers, and is selectively read out via switch gates onto a large number of first normal data lines DL <511:0> and first parity data lines PDL <9:0>. The sense amplifiers correspond to respective pairs of bit lines and are generally arranged in a plurality of columns within the memory array.

The bit lines are formed in a direction orthogonal to the word lines WL. Here, a large number of first normal data lines DL <511:0> and the first parity data lines PDL <9:0> are advantageously formed in a direction parallel to the bit lines. If multi-layer wiring is employed, an area penalty can be avoided.

A first data latch column 300 includes a first normal latch 300a and a first parity latch 300b. The memory array 100 and the first data latch column 300 are connected via the first normal data lines DL <511:0> and the first parity data lines PDL <9:0>. By the first data latch column 300 latching data, the memory array 100 can be caused to go to the next operation. In Embodiment 1, the first normal data lines DL <511:0> has 512 bits for normal data, and the first parity data line PDL <9:0> has 10 bits for parity data.

Data latched by the first data latch column 300 is connected via second normal data lines DQ <511:0> and second parity data lines PDQ <9:0> to an ECC circuit section 400. In Embodiment 1, the second normal data lines DQ <511:0> has 512 bits for the first normal latch 300a, and the second parity data line PDQ <9:0> has 10 bits for the first parity latch 300b.

Although not illustrated in detail in FIG. 1, the ECC circuit section 400 generates syndrome data from normal data and parity data latched by the first data latch column 300 and decodes the generated syndrome data to perform error detection and error correction. The ECC circuit section 400 also generates parity data from data that is externally written, and writes the parity data to the parity array 100b.

An input/output circuit section 500 is a data interface portion between the ECC circuit section 400 and the first data latch column 300, and an external terminal. In this embodiment, the input/output circuit section 500 includes an input buffer connected to third input data lines DI <511:0> and an output buffer connected to third output data lines DO <511:0>.

In the thus-configured semiconductor storage device, the first data latch column 300 is arranged in a column in a direction in which the word line extends, with respect to the first normal data lines DL <511:0> and the first parity data lines PDL <9:0> that are formed in a direction orthogonal to the word lines WL. The first data latch column 300 is also arranged as close to the memory array 100 as possible. In this case, the first data latch column 300 may be divided into a plurality of columns so as to reduce the layout pitch.

Further, the ECC circuit section 400 is arranged close to the first data latch column 300 in a direction in which the first data line extends, and an input/output circuit section 500 is arranged on the outer side of and close to the ECC circuit section 400. By arranging each block as described above, a shortest data path can be provided, extending from the memory array 100 to the input/output circuit section 500. In this case, the first data latch column 300, the ECC circuit section 400, and the input/output circuit section 500 are substantially uniformly arranged within a region defined by a width Y in which the memory array 100 is provided.

As described above, the blocks are arranged close to each other in a direction orthogonal to the word line so that the data path system has a short wiring distance, thereby making it possible to achieve a multi-bit (512-bit) ECC process without an increase in wiring area, and suppress multi-bit read and write delay times, so that an access penalty due to an ECC process can be suppressed to the extent possible.

In Embodiment 1, for 512-bit normal data, only 10 parity bits are required, resulting in a significant reduction in the proportion of parity bits.

This embodiment is applied to a DRAM only for illustrative purposes. A similar effect can be obtained when the present invention is applied to other semiconductor storage devices (an SRAM, a flash memory, etc.).

Variation 1 of Embodiment 1

Figure 2:
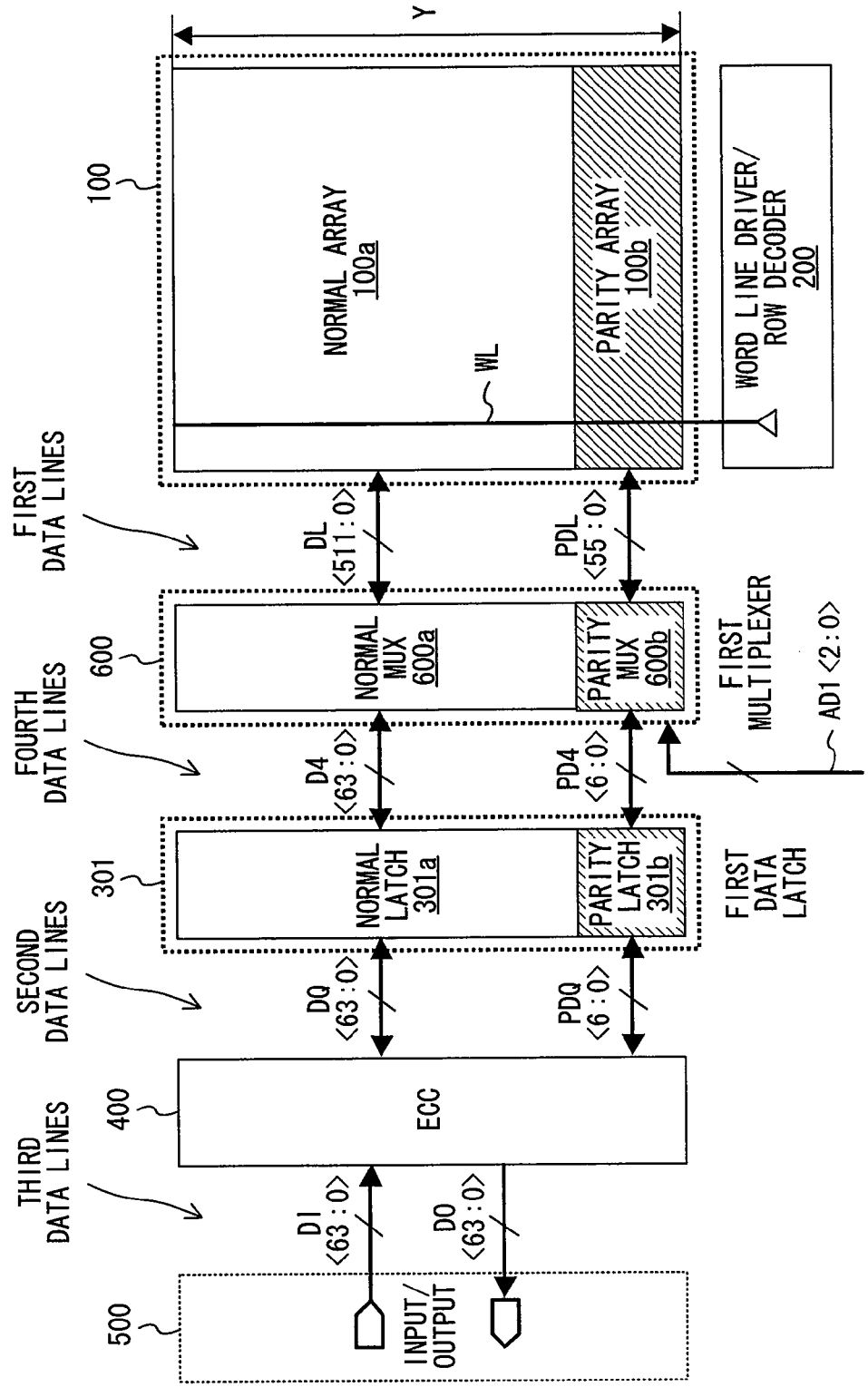
FIG. 2 is a block diagram showing a configuration of a semiconductor storage device according to Variation 1 of Embodiment 1 of the present invention.

FIG. 2 is a diagram schematically showing a semiconductor storage device with an ECC circuit according to Variation 1 of Embodiment 1 of the present invention. Variation 1 is characterized in that first data lines via which data is read from and written to a memory array 100 are, for example, connected to a first data latch column 301 via a first multiplexer column 600 that is, for example, selected in accordance with a 3-bit address signal AD1 <2:0>.

In this embodiment, a multiplexer having an 8-to-1 selection function is employed. Specifically, the first multiplexer column 600 includes a plurality of first normal multiplexers 600a and a plurality of first parity multiplexers 600b. For example, a fourth normal data line D4 <0> is provided as an output with respect to a first normal data line DL <0> to a first normal data line DL <7>. Similarly, for parity data, a fourth parity data line PD4 <0> is provided as an output with respect to a first parity data line PDL <0> to a first parity data line PDL <7>.

The multiplexed fourth data lines have 64 normal bits and 7 parity bits. Data on the fourth data lines is latched by the first data latch column 301 and is subjected to an error correction process by the ECC circuit section 400.

In the configuration of Embodiment 1 (see FIG. 1), 512 normal bits and 10 parity bits are directly latched by the first data latch column and are subjected to an ECC process without using a multiplexer. Therefore, the number of ECC process bits is as many as 512 bits, so that the number of process gate stages is increased, resulting in a delay in process time required for ECC. Also, the layout area of the ECC circuit section 400 increases.

In contrast to this, in this embodiment, the number of ECC process bits can be decreased to 64 bits by using a multiplexer, so that a process time required for ECC can be suppressed. Also, the gate scale of the ECC circuit section 400 can be reduced, resulting in a reduction in layout area. Further, the number of latch units in the first data latch column 301 can be reduced to a number corresponding to 64 bits+7 bits, so that the layout pitch and the area can be reduced.

Here, the first multiplexer column 600 is arranged within a region defined by a width Y in which the memory array 100 is formed, between the memory array 100 and the first data latch column 300 and adjacent to the respective blocks. In the first multiplexer column 600, data bits are arranged in a column of bit slices. Therefore, wiring can be achieved without interruption of a data path. Also, in the normal bit section and the parity bit section, the same circuit configuration can be used to achieve substantially a uniform layout.

Further, since the first multiplexer column 600 is provided, data that is subjected to an ECC process during the same operation cycle is, for example, DL <0>, DL <8>, DL <16>, . . . , and DL <504> and PDL <0>, PDL <8>, PDL <16>, . . . , and PDL <48> of the first data lines. By arranging these first data lines so as not to be physically adjacent to each other, even if a multi-bit defect occurs, such as a short-circuit between adjacent data lines due to a defect caused by dust or the like in the memory array 100, the multi-bit defect will become a 1-bit defect when an ECC process is performed.

Although an 8-to-1 multiplexer is employed in this embodiment, other configurations may be employed. In this case, an area penalty due to the provision of a parity array desirably falls within a range that allows speed performance to be satisfied.

Variation 2 of Embodiment 1

Figure 3:
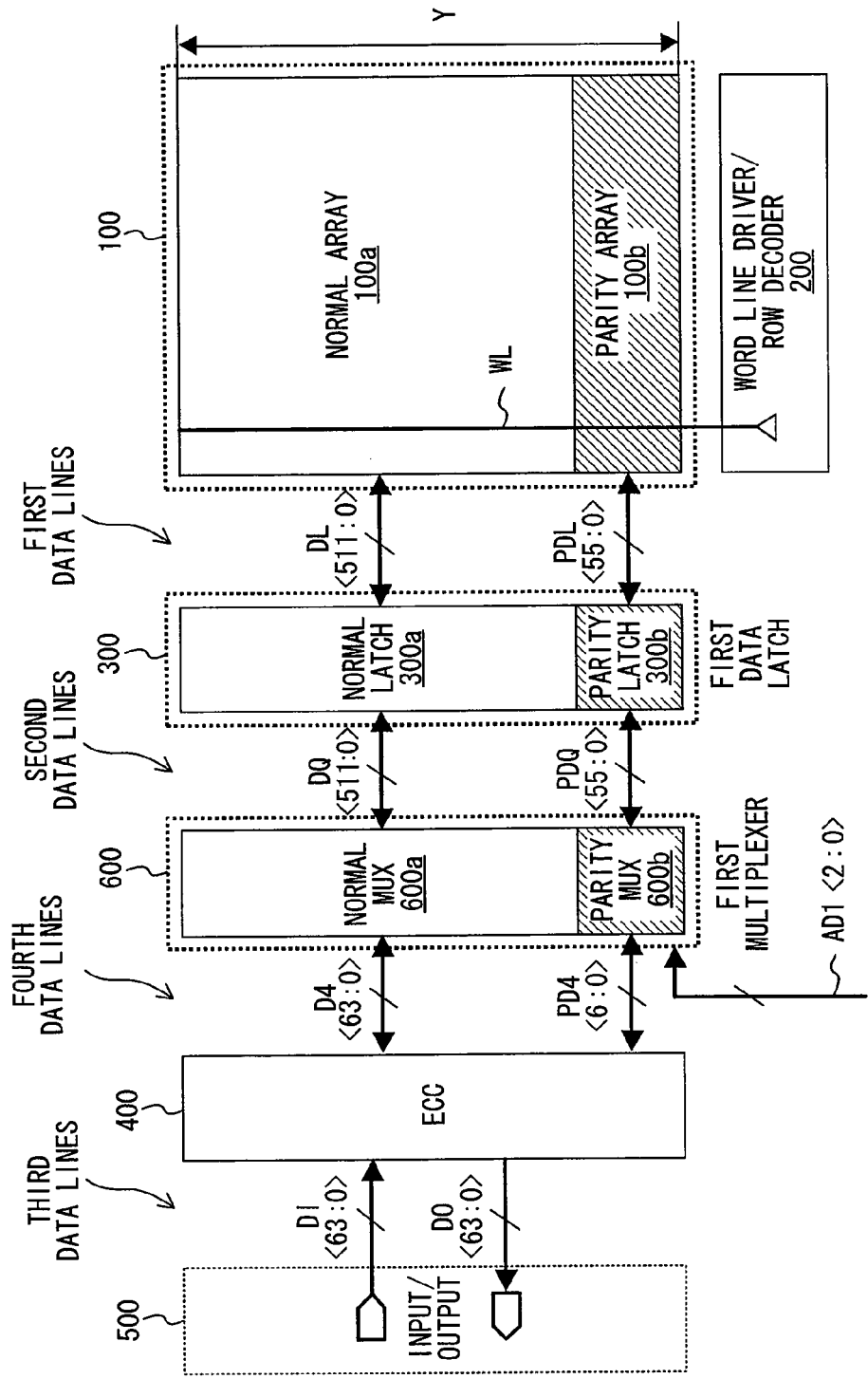
FIG. 3 is a block diagram showing a configuration of a semiconductor storage device according to Variation 2 of Embodiment 1 of the present invention.

FIG. 3 is a diagram schematically showing a semiconductor storage device with an ECC circuit according to Variation 2 of Embodiment 1 of the present invention. Variation 2 is characterized in that second data lines latched by a first data latch column 300 are, for example, connected to an ECC circuit section 400 via a first multiplexer column 600 that is selected in accordance with a 3-bit address signal AD1 <2:0>.

Particularly, Variation 2 is more effective when it is applied to a semiconductor storage device having a page-mode operation.

The first multiplexer column 600 has the same configuration as that of Variation 1 of Embodiment 1 (see FIG. 2). For example, a fourth normal data line D4 <0> is provided as an output with respect to a second normal data line DQ <0> to a second normal data line DQ <7>. Similarly, for parity data, a fourth parity data line PD4 <0> is provided as an output with respect to a second parity data line PDQ <0> to a second parity data line PDQ <7>.

The multiplexed fourth data lines have 64 normal bits and 7 parity bits. Data on the fourth data lines is subjected to an error correction process by the ECC circuit section 400.

This embodiment is characterized in that the first multiplexer column 600 is arranged after the first data latch column 300 and adjacent to the first data latch column 300, within a region defined by a width Y in which the memory array 100 is formed. In the first multiplexer column 600, data bits are arranged in a column of bit slices. The number of latches in the first data latch columns 300 is equal to the number of the first data lines. Therefore, all data that is accessed in the memory array 100 in a single row address cycle can be latched, and a page length can be set in a page mode of a DRAM. Also, data latched by the first data latch column 300 can be successively accessed, so that it is not necessary to access the memory array 100 in each ECC process cycle, resulting in a reduction in access time.

Also, the provision of a multiplexer can allow an effect similar to Variation 1 of Embodiment 1 (see FIG. 2) to be obtained.

Variation 3 of Embodiment 1

Figure 4:
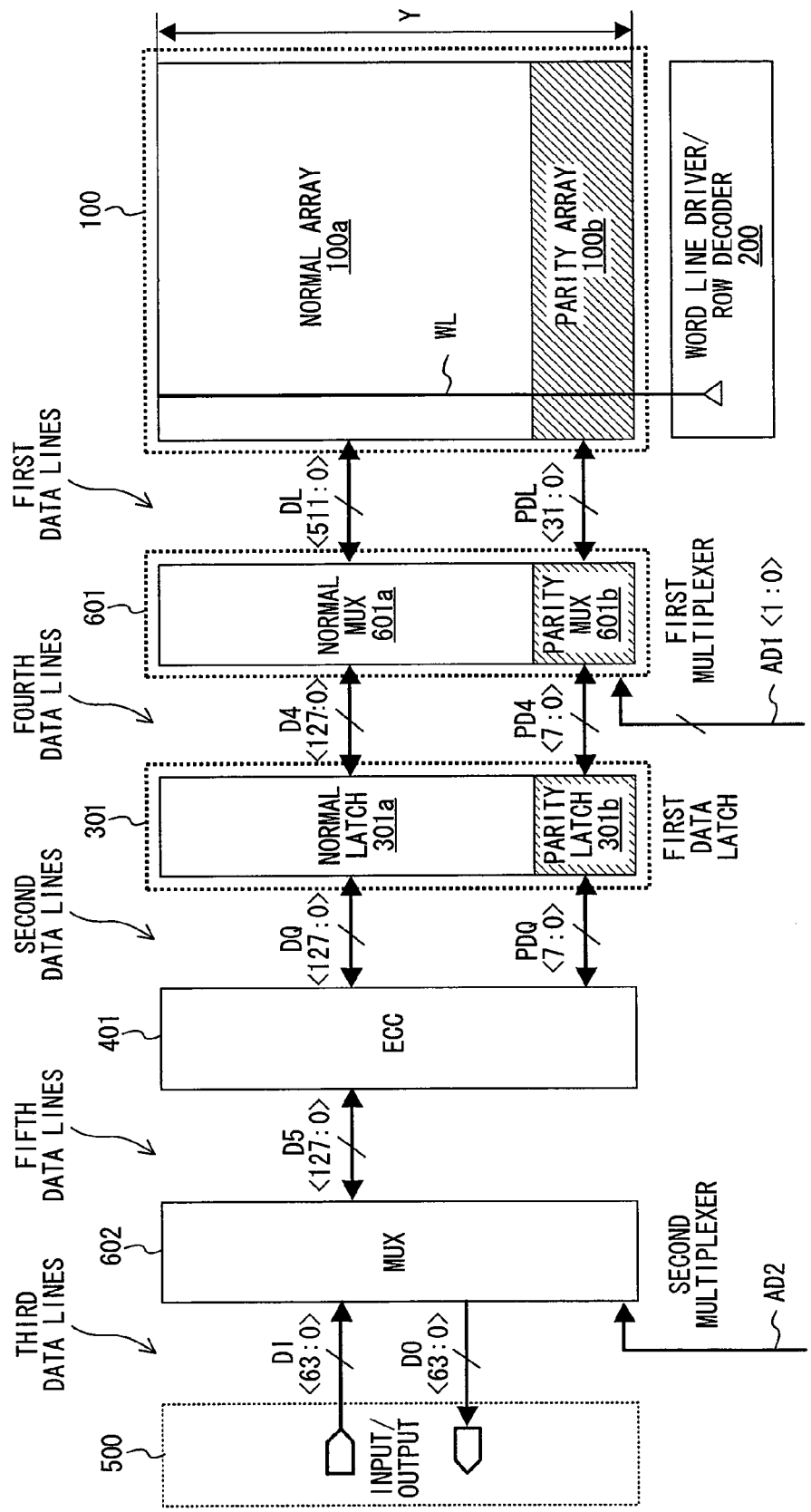
FIG. 4 is a block diagram showing a configuration of a semiconductor storage device according to Variation 3 of Embodiment 1 of the present invention.

FIG. 4 is a diagram schematically showing a semiconductor storage device with an ECC circuit according to Variation 3 of Embodiment 1 of the present invention. Variation 3 is different from Embodiment 1 (see FIG. 1) in that a multiplexer is provided before a first data latch column 301 and after an ECC circuit section 401, and the number of ECC process bits is 128 bits.

In this embodiment, first data lines of a memory cell array 100 are selectively input via a first multiplexer column 601 to the first data latch column 301. An output of the first data latch column 301 is output to the ECC circuit section 401. Fifth data lines that have been subjected to error correction by the ECC circuit section 401 are further input via a second multiplexer column 602 to an input/output circuit section 500.

The first multiplexer column 601 includes 128 second normal multiplexers 601a and 8 second parity multiplexers 601b. For example, the first multiplexer column 601 has a 4-to-1 selection function in accordance with a 2-bit address signal AD1 <1:0>. For example, a fourth normal data line D4 <0> is provided as an output with respect to a first normal data lines DL <0> to a first normal data line DL <3>. Similarly, for parity data, a fourth parity data line PD4 <0> is provided as an output with respect to a first parity data line PDL <0> to a first parity data line PDL <3>.

A second multiplexer column 602 includes 64 multiplexers. For example, the second multiplexer column 602 has a 2-to-1 selection function in accordance with a 1-bit address signal AD2. For example, a third data line DO <0> is provided as an output with respect to a fifth data line D5 <0> to a fifth data line D5 <1>.

Each of the above-described circuit blocks is arranged in a column within a region defined by a width Y of the memory array 100. The first multiplexer column 601, the first data latch column 301, the ECC circuit section 401, the second multiplexer column 602, and the input/output circuit section 500 are successively arranged in a direction away from the memory array 100, and are arranged in bit slices along a data path. Thereby, the wiring length of the data path can be caused to be shortest and to be formed in the same direction, so that an efficient layout can be obtained while suppressing a wiring delay.

Note that when the circuit scale of the second multiplexer column 602 can be caused to be small as compared to the first data latch column 301, the ECC circuit section 401 and the second multiplexer column 602 can be arranged on the same column. Further, the ECC circuit section 401, the second multiplexer column 602, and the input/output circuit section 500 can be arranged on the same column. The layout area may be desirably further reduced within an acceptable speed performance range.

The number of first normal data lines is 512 and the number of third data lines is 64 in this embodiment as well as Variation 1 of Embodiment 1 (see FIG. 2) and Variation 2 of Embodiment 1 (see FIG. 3). Alternatively, the ECC circuit section 401 may be caused to handle 128 bits, the first multiplexer column 601 may be provided before the first data latch column 301, and the second multiplexer column 602 may be provided after the ECC circuit section 401. In this case, the number of parity bits can be reduced, resulting in a decrease in chip area. On the other hand, the increase of the process time and circuit scale of the ECC circuit section 401 and the addition of the second multiplexer column 602 are relatively small.

Although the first multiplexer column 601 has a 4-to-1 configuration and the second multiplexer column 602 has a 2-to-1 configuration in this embodiment, the present invention is not particularly limited to this. An essential nature of the present invention is such that a configuration with a higher level of flexibility is provided so that optimal ECC process units can be selected, corresponding to various memory configurations or required performance. Therefore, other configurations can be used to obtain a similar effect.

Variation 4 of Embodiment 1

Figure 5:
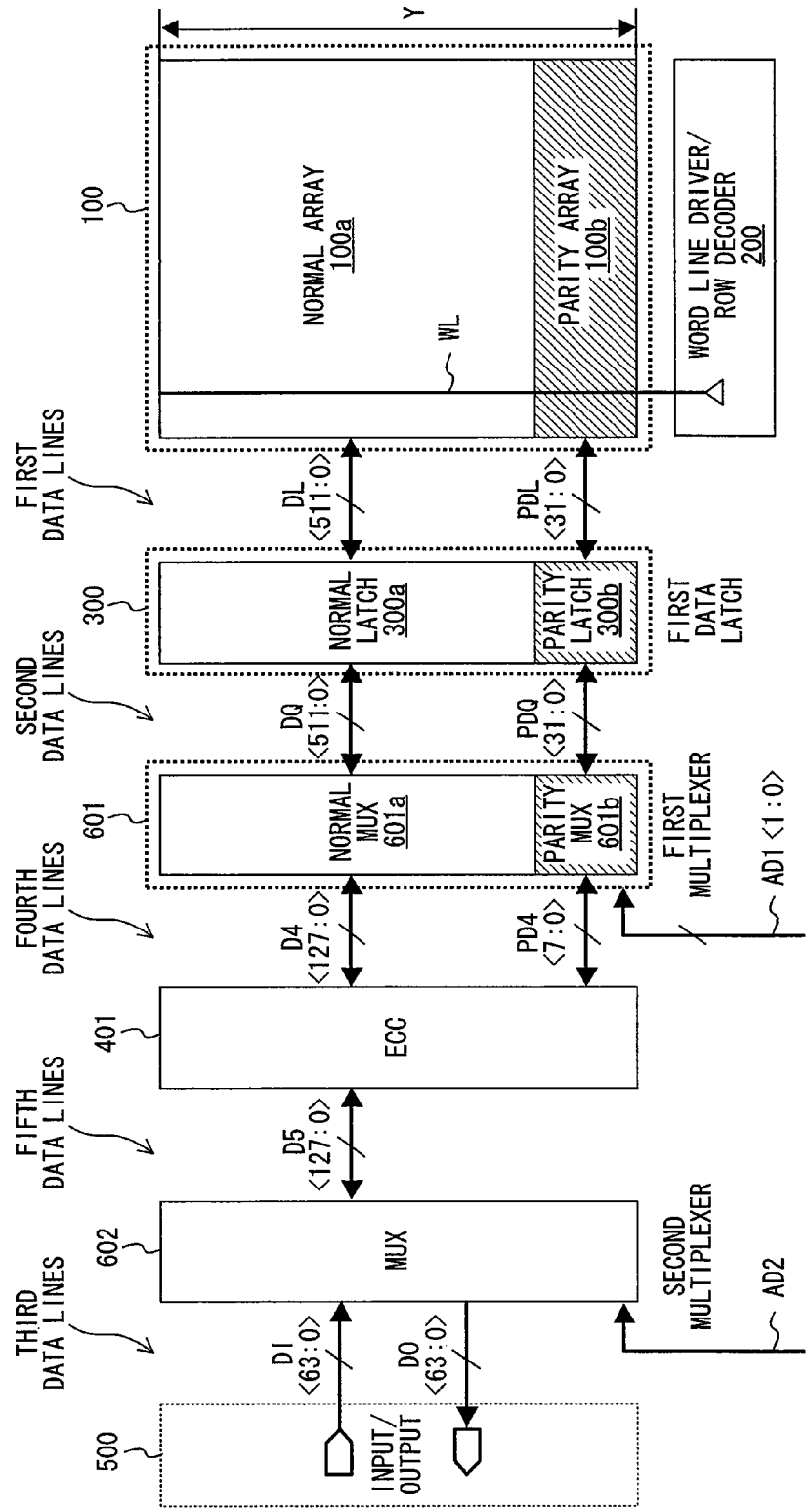
FIG. 5 is a block diagram showing a configuration of a semiconductor storage device according to Variation 4 of Embodiment 1 of the present invention.

FIG. 5 is a diagram schematically showing a configuration of a semiconductor storage device with an ECC circuit according to Variation 4 of Embodiment 1 of the present invention. Variation 4 is different from Embodiment 1 (see FIG. 1) in that a multiplexer is provided before and after an ECC circuit section 401, and the number of ECC process bits is 128 bits.

In this embodiment, second data lines latched by the first data latch column 300 are input via a first multiplexer column 601 to the ECC circuit section 401. Fifth data lines that have been subjected to error correction by the ECC circuit section 401 are input via a second multiplexer column 602 to an input/output circuit section 500.

The first multiplexer column 601 includes 128 second normal multiplexers 601a and 8 second parity multiplexers 601b, and for example, has a 4-to-1 selection function in accordance with a 2-bit address signal AD1 <1:0>. For example, a fourth normal data line D4 <0> is provided as an output with respect to a second normal data line DQ <0> to a second normal data line DQ <3>. Similarly, for parity data, a fourth parity data line PD4 <0> is provided as an output with respect to a second parity data line PDQ <0> to a second parity data line PDQ <3>.

The second multiplexer column 602 includes 64 multiplexers, and for example, has a 2-to-1 selection function in accordance with a 1-bit address signal AD2. For example, a third data line DO <0> is provided as an output with respect to a fifth data line D5 <0> to a fifth data line D5 <1>.

Each of the above-described circuit blocks is arranged in a column within a region defined by a width Y of a memory array 100. The first data latch column 300, the first multiplexer column 601, the ECC circuit section 401, the second multiplexer column 602, and the input/output circuit section 500 are successively arranged in a direction away from the memory array 100, and are arranged in bit slices along a data path. Thereby, the wiring length of the data path can be caused to be shortest and to be formed in the same direction, so that an efficient layout can be obtained while suppressing a wiring delay.

Note that when the circuit scale of the second multiplexer column 602 can be caused to be small as compared to the first data latch column 300, the ECC circuit section 401 and the second multiplexer column 602 can be arranged on the same column. Further, the ECC circuit section 401, the second multiplexer column 602 and the input/output circuit section 500 can be arranged on the same column. The layout area may be desirably further reduced within an acceptable speed performance range.

The number of first normal data lines is 512 and the number of third data lines is 64 in this embodiment as well as Variation 1 of Embodiment 1 (see FIG. 2) and Variation 2 of Embodiment 1 (see FIG. 3). Alternatively, the ECC circuit section 401 may be caused to handle 128 bits, the first multiplexer column 601 may be provided before the ECC circuit section 401, and the second multiplexer column 602 may be provided after the ECC circuit section 401. In this case, the number of parity bits can be reduced, resulting in a decrease in chip area. On the other hand, the increase of the process time and circuit scale of the ECC circuit section 401 and the addition of the second multiplexer column 602 are relatively small.

Although the first multiplexer column 601 has a 4-to-1 configuration and the second multiplexer column 602 has a 2-to-1 configuration in this embodiment, the present invention is not particularly limited to this. An essential nature of the present invention is such that a configuration with a higher level of flexibility is provided so that optimal ECC processes can be selected, corresponding to various memory configurations or required performance. Therefore, other configurations can be used to obtain a similar effect.

Figure 6:
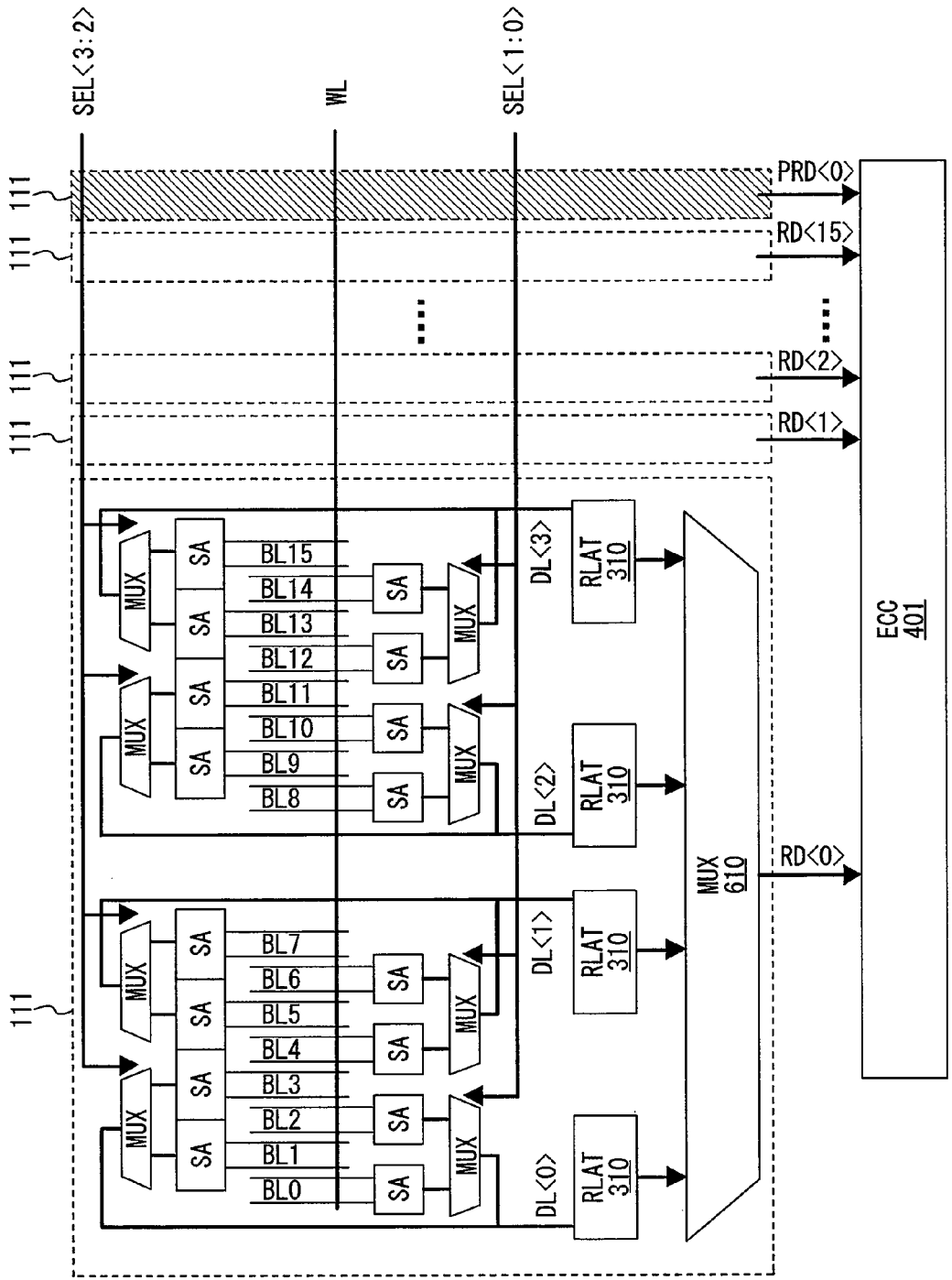
FIG. 6 is a block diagram specifically showing a configuration of a portion of the semiconductor storage device of Variation 4 of Embodiment 1.

FIG. 6 is a block diagram more specifically showing a configuration of a portion of Variation 4 (see FIG. 5) of Embodiment 1 of the present invention. The effect of providing a multiplexer will be described with reference to FIG. 6.

In FIG. 6, a memory cell is provided at each of intersections of word lines WL and bit line pairs BL0 to BL15, i.e., the memory cells are arranged in a matrix. Sense amplifiers SA connected to the bit line pairs are arranged alternately in bit line pairs. Data on a memory cell selected by a selected word line WL is read onto one of a pair of bit lines and is then detected and amplified by a sense amplifier. The amplified data on the bit line pair is selectively read onto data line pairs DL <0> to DL <3> in accordance with connection control signals SEL <0> to SEL <3>, and is then latched by a read latch circuit 310. The data latched by the read latch circuit 310 is selected by a 4-to-1 multiplexer 610, and is then input as normal read data RD <15:0> and parity read data PRD <0> to the ECC circuit section 401.

The data line pairs are connected in common to a plurality of sense amplifier arrays, extending vertically across the memory array. The number of the data line pairs is considerably large and the data line pairs are densely arranged. Therefore, when a defect occurs due to dust or the like during a manufacturing process, the defect is likely to lie on a plurality of wiring lines.

Since the ECC circuit section 401 can correct only one bit, a defect as described above cannot be corrected. Therefore, a data unit input to the multiplexer 610 is set to be a unit memory 111. Within each unit memory 111, data line pairs DL <0> to DL <3> are successively arranged. Further, unit memories are successively arranged in a manner that avoids data lines to be simultaneously selected from being adjacent to each other. With this configuration, data lines to be simultaneously selected are arranged every four data lines, so that a defect as described above is generally error-corrected as a 1-bit defect by the ECC circuit section 401, resulting in a significant reduction in frequency of occurrence of a defect.

On the other hand, for the bit line pairs, the outputs of the sense amplifiers are multiplexed in accordance with the connection control signals SEL <0> to SEL <3> for the data lines, and the bit lines are arranged in a manner that avoids bit lines corresponding to data that is simultaneously subjected to an ECC process from being adjacent to each other. In this case, a continuous defect within eight neighboring bit line pairs and a memory cell block defect can be similarly error-corrected, resulting in a significant reduction in frequency of occurrence of a defect.

Although the bit line pairs BL0 to BL15 and the data line pairs DL <0> to DL <3> have a complementary configuration in this embodiment, they may have a single-end configuration, which can lead to a similar effect.

The unit memory 111 can have the same configuration between the normal array and the parity array, so that the uniformity of a layout pattern can be increased, thereby suppressing variations during manufacture.

Figure 7:
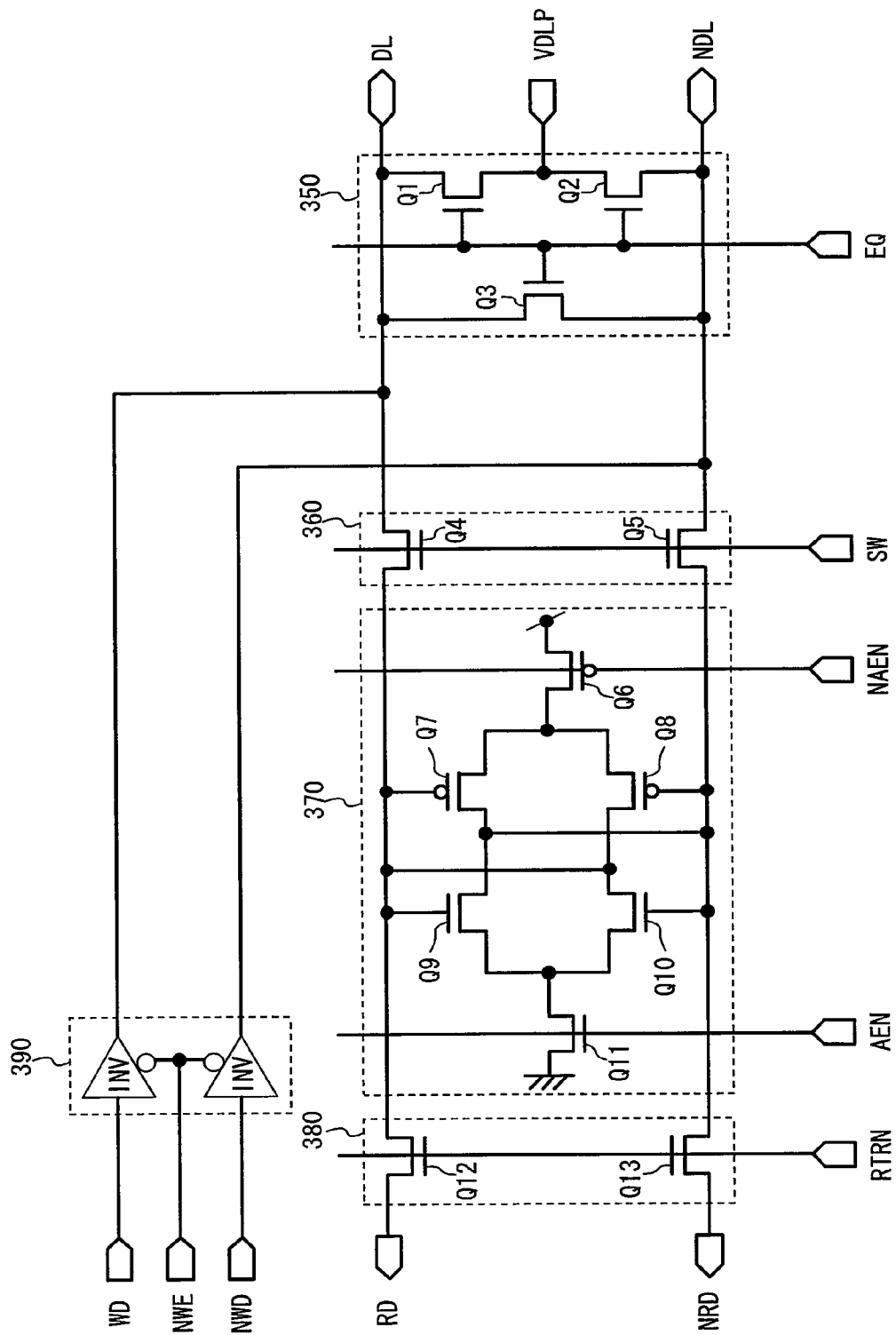
FIG. 7 is a circuit diagram showing a data latch in the semiconductor storage device of Embodiment 1.

FIG. 7 shows an exemplary unit circuit corresponding to the first data latch columns 300 and 301 of FIGS. 1 to 5. The latch unit circuit of FIG. 7 includes a read amplifier (read latch circuit) 370 for detecting, amplifying and latching a potential difference read out from a memory array onto complementary data lines DL and NDL in accordance with control signals AEN and NAEN, a data line precharging/equalizing circuit 350 for precharging and equalizing the complementary data lines DL and NDL using a power supply VDLP in accordance with a control signal EQ, a read amplifier switch 360 for disconnecting the complementary data lines DL and NDL from the read amplifier 370 in accordance with a control signal SW after an operation of the read amplifier 370, a read transfer gate 380 for transferring data latched by the read amplifier 370 to read data lines RD and NRD in accordance with a control signal RTRN, and a write buffer 390 for buffering and supplying data on write data lines WD and NWD onto the complementary data lines DL and NDL in accordance with a control signal NWE. In FIG. 7, Q1 to Q5 and Q9 to Q13 indicate N-channel MOS transistors, and Q5 to Q8 indicate P-channel MOS transistors.

In this embodiment, a general configuration of a DRAM is illustrated. Other configurations that have a similar function may be employed. Also, the present invention may be applied to a sense amplifier section of an SRAM or a flash memory.

Embodiment 2

Figure 8:
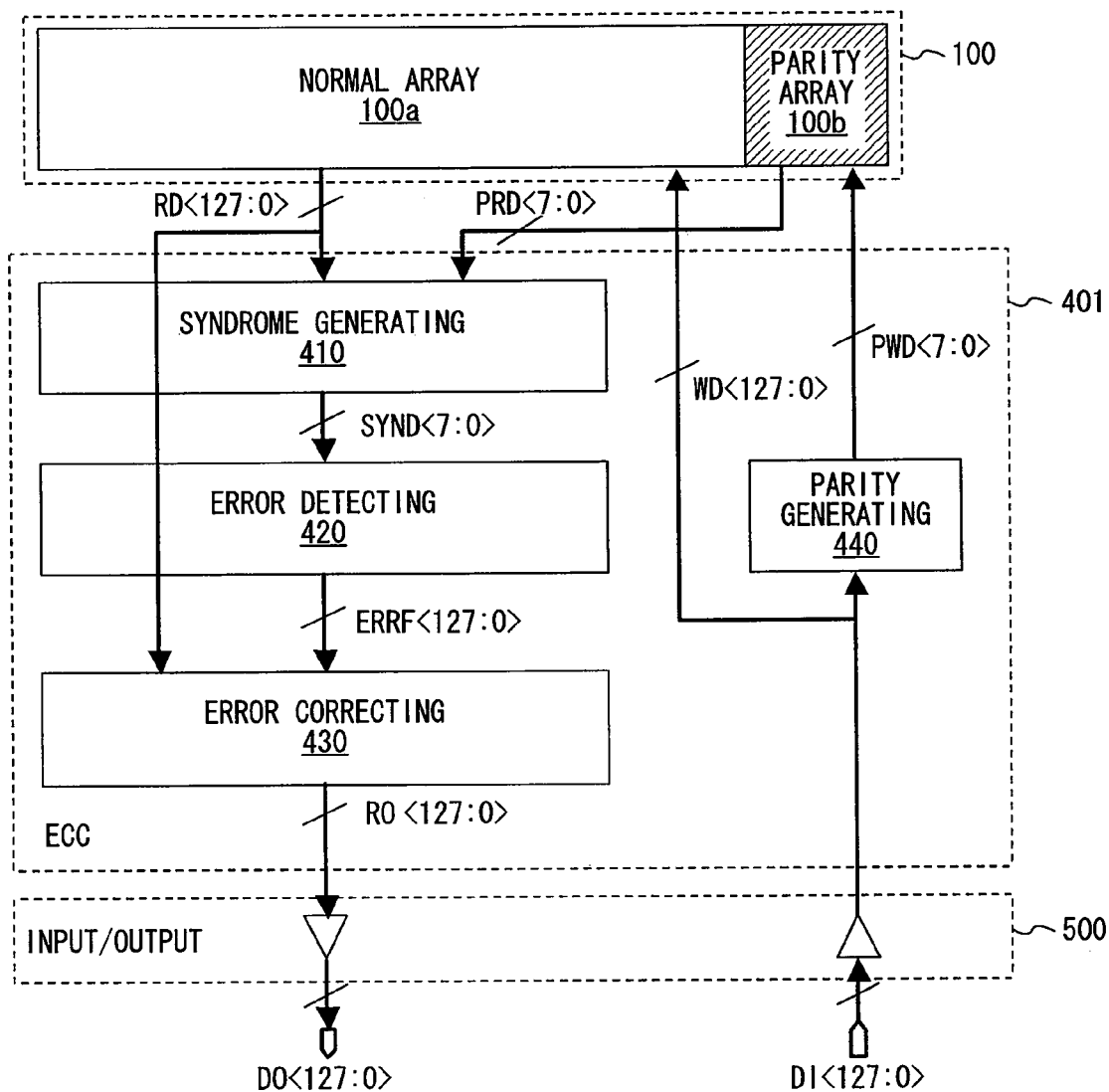
FIG. 8 is a block diagram showing a configuration of an ECC circuit section in a semiconductor storage device according to Embodiment 2 of the present invention.

FIG. 8 is a diagram showing a block configuration of an ECC circuit section that is applied to a semiconductor storage device according to Embodiment 2 of the present invention, and a flow of data. In FIG. 8, a memory array 100 includes a normal array 100*a* and a parity array 100*b*. Although not illustrated for the sake of simplicity, a configuration that includes a data latch column and a multiplexer column as illustrated in Embodiment 1 and its variations may be employed to achieve a similar effect.

An ECC circuit section 401 includes a syndrome generating section 410 for receiving normal read data RD <127:0> and parity read data PRD <7:0> as input data and outputting a syndrome calculation result as syndrome data SYND <7:0>, an error detecting section 420 for decoding the syndrome data SYND <7:0> to detect an error bit and outputting the result as error flags ERRF <127:0>, an error correcting section 430 for correcting the normal read data RD <127:0> in accordance with the error flag ERRF <127:0> and outputting the result as correct data RO <127:0>, and a parity generating section 440 for outputting parity write data PWD <7:0> based on externally input data by a parity generating matrix circuit employing a Hamming code technique. WD <127:0> indicates normal write data. The input/output circuit section 500 includes an output buffer and an input buffer that interface the outside. The output buffer is connected to output data lines DO <127:0> and the input buffer is connected to input data lines DI <127:0>.

Figure 9:
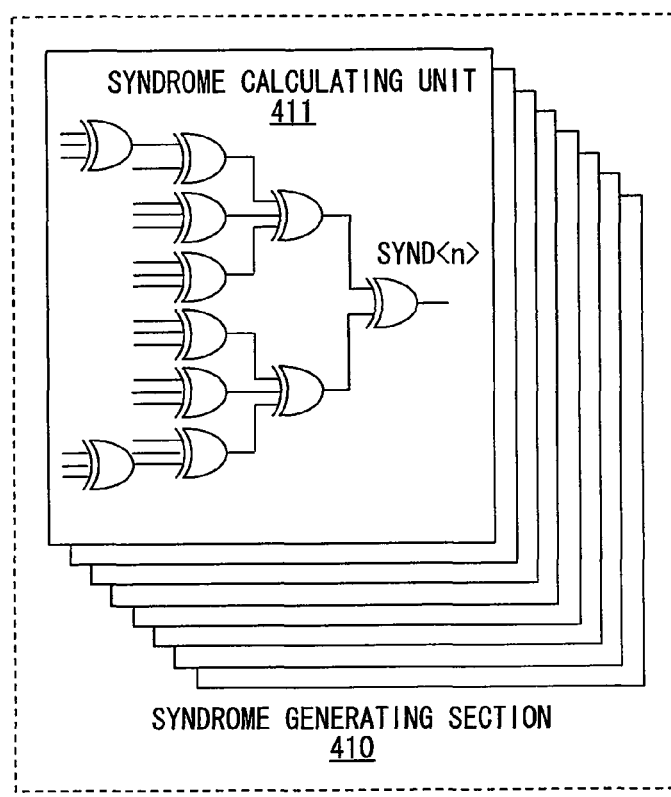
FIG. 9 is a circuit diagram specifically showing a syndrome generating section in the ECC circuit of Embodiment 2.

FIG. 9 is a circuit diagram showing a specific example of the syndrome generating section 410. Eight syndrome calculating units 411 each including an EXOR (logical exclusive OR) matrix are arranged, corresponding to parity bits. Each syndrome calculating unit 411 outputs an output signal SYND <n>.

Figure 10:
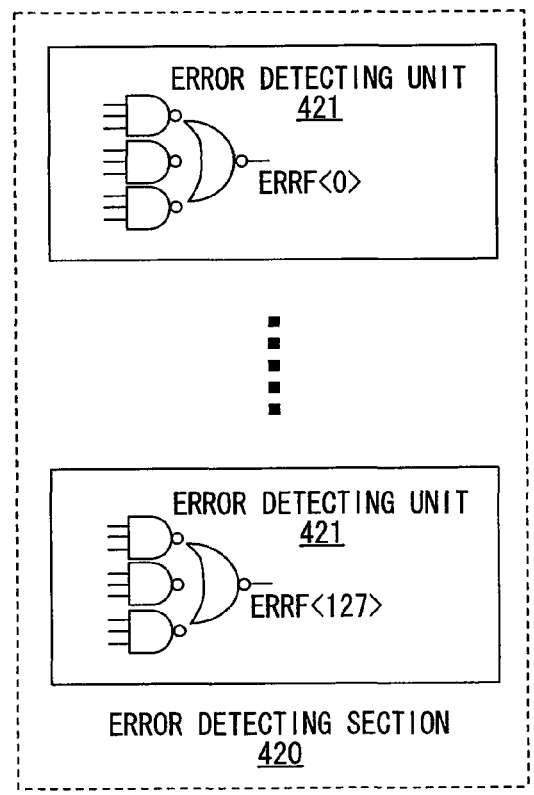
FIG. 10 is a circuit diagram specifically showing an error detecting section in the ECC circuit of Embodiment 2.

FIG. 10 is a circuit diagram showing a specific example of the error detecting section 420. One hundred twenty eight error detection units 421 for decoding input data using a NAND circuit arrangement are arranged to obtain 128-bit error flags ERRF <n> from the results of decoding.

Figure 11:
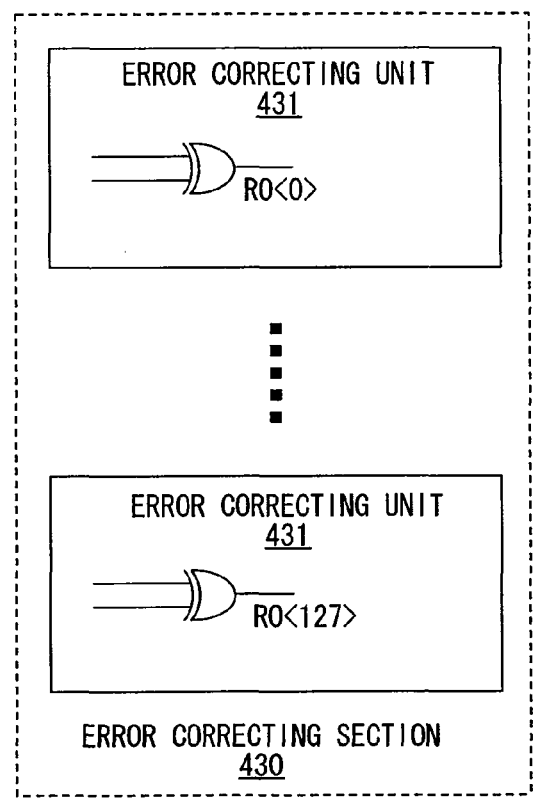
FIG. 11 is a circuit diagram specifically showing an error correcting section in the ECC circuit of Embodiment 2.

FIG. 11 is a circuit diagram showing a specific example of the error correcting section 430. One hundred twenty eight error correction units 431 for performing logical inversion using EXOR (logical exclusive OR) when there is a mismatch between inputs are arranged to output resultant corrected data RO <n>.

Figure 12:
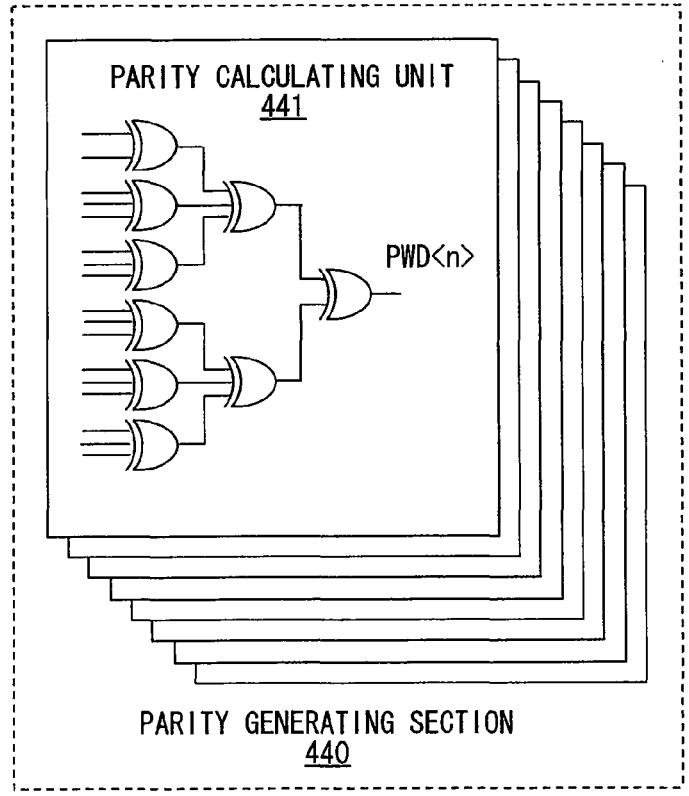
FIG. 12 is a circuit diagram specifically showing a parity generating section in the ECC circuit of Embodiment 2.

FIG. 12 is a circuit diagram showing a specific example of the parity generating section 440. Eight parity calculating units 441 including EXOR (logical exclusive OR) using Hamming codes are arranged, corresponding to parity bits, to obtain output signals PWD <n> of the parity calculating units 441.

Note that the circuits of FIGS. 9, 10, 11 and 12 are only for illustrative purposes, and other circuit configurations may be employed to achieve a similar function.

Figure 13:
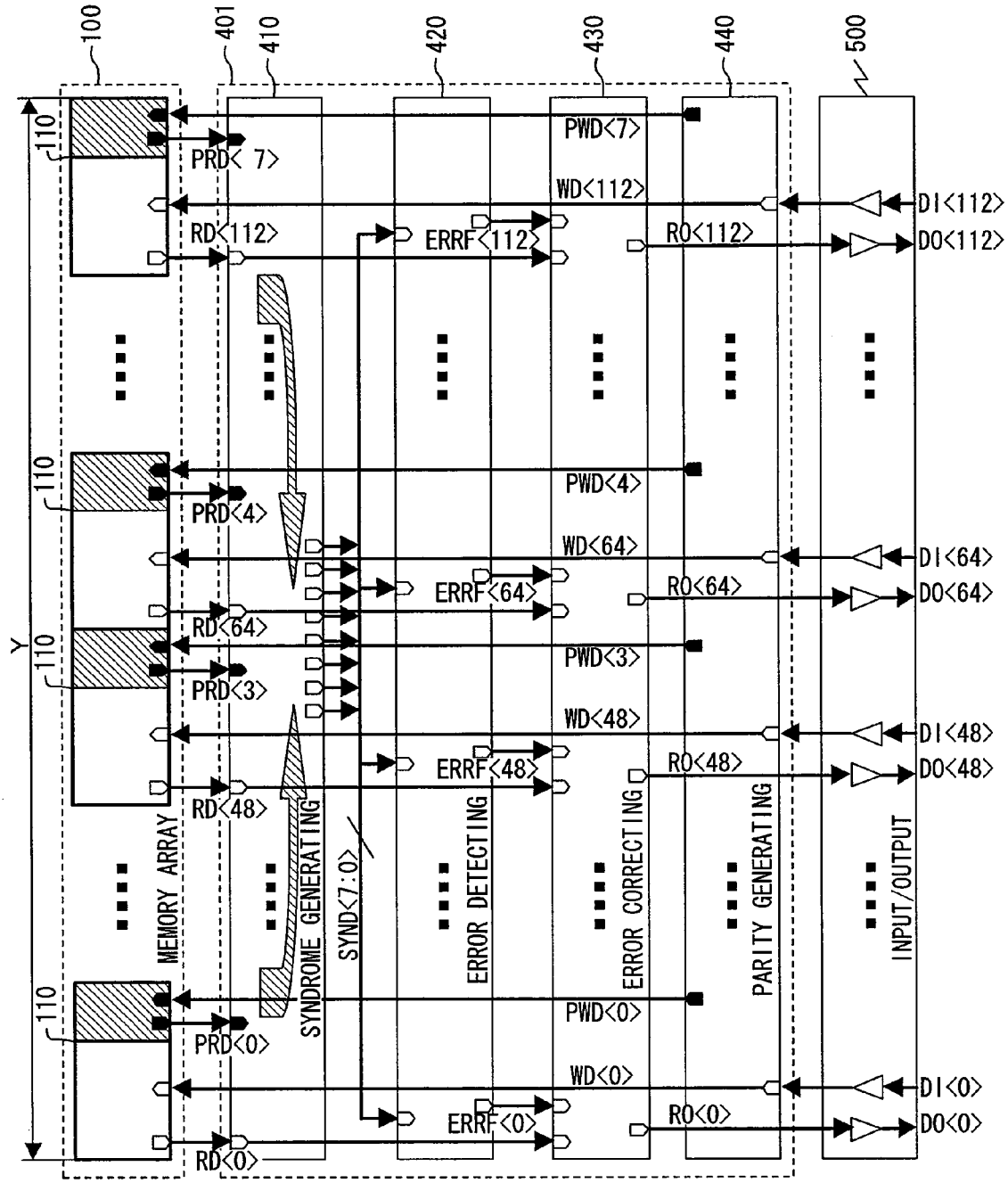
FIG. 13 is a diagram schematically showing a layout of the ECC circuit of Embodiment 2.

FIG. 13 is a diagram showing a layout configuration of a portion of the block configuration of the ECC circuit section 401 of FIG. 8. In FIG. 13, a memory array 100 shows the whole normal array and parity array. The memory array 100 is divided into eight sub-memory arrays 110 each including a normal array and a parity array. The ECC circuit section 401 performs a 128-bit process, and has a circuit configuration as described above. An input/output circuit section 500 includes an output buffer and an input buffer that interface the outside.

In the ECC circuit section 401, a syndrome generating section 410, an error detecting section 420, an error correcting section 430, and a parity generating section 440 are successively arranged in a direction away from the memory array 100 and are arranged adjacent to each other. Each of these circuit blocks is formed within a region defined by a width Y of the memory array 100.

Data transfer is performed between the memory array 100 and the ECC circuit section 401 using 128-bit normal read data RD <127:0> and 128-bit normal Write data WD <127:0>, and 8-bit parity read data PRD <7:0> and 8-bit parity write data PWD <7:0>.

Also, the sub-memory array 110 includes 16-bit normal read data RD <n×16+15:n×16> and 16-bit normal write data WD <n×16+15:n×16>, and 1-bit parity read data PRD <n> and 1-bit parity write data PWD <n>, where n is an integer of 0 to 7.

In this embodiment, the eight sub-memory arrays 110 are equally spaced, and parity bits are equally spaced and distributed. Also, data line input portions of the syndrome generating section 410 are arranged, corresponding to positions of data lines of the sub-memory array 110. With this arrangement, the normal read data RD <127:0> and the parity read data PRD <7:0> can be formed in straight lines and with a shortest distance, and bits can have a uniform wiring length. Thereby, the parasitic load of the data line can be minimized. Therefore, a spare wiring region is not required, so that the delay time and the layout area are effectively suppressed.

The syndrome calculation result SYND <7:0> of the syndrome generating section 410 is arranged in the vicinity of a middle portion of the syndrome generating section 410 so that inputs of EXOR calculation matrices that are distributed within the region defined by the width Y, are converged toward the middle portion as the data flows from one circuit state to the next. Thereby, delay times in the syndrome calculating units 411 are caused to be uniform, so that the loads of the output signals SYND <7:0> supplied to the next error detecting section 420 can be caused to be uniform.

The error detecting section 420 includes 128 error detection units 421 corresponding to the number of ECC process bits. The error correcting section 430 also includes 128 error correction units 431 corresponding to the number of ECC process bits. The error detection unit 421 and the error correction unit 431 are arranged in bit slices, corresponding to the normal read data RD <127:0>. With this configuration, the normal read data RD <127:0> and the error flags ERRF <127:0> can be formed in substantially straight lines and with a shortest distance.

In the parity generating section 440, pins through which a write signal is externally input are positioned in the vicinity of the normal read data RD <127:0> arranged in bit slices, corresponding to bits, and the parity write data PWD <7:0> to be output are arranged so that they can be arranged in substantially straight lines, corresponding to the respective sub-memory arrays 110. Also, the normal write data WD <127:0> are extended from the input pins and are connected to the corresponding sub-arrays 110.

On the other hand, the error detection unit 421 and the error correction unit 431 do not need to be provided in regions of the error detecting section 420 and the error correcting section 430 corresponding to the parity arrays of the sub-memory arrays 110. Therefore, although not particularly limited, these regions can be used as regions where buffers for a control signal and an address signal for controlling the data latch and the multiplexer described in Embodiment 1 are provided. Also, a smoothing capacitor for a power supply can be provided to stabilize the power supply, and a dummy pattern can be provided to suppress variations during manufacture.

Also in the input/output circuit section 500, input buffers and output buffers are arranged in bit slices, corresponding to data bits.

As described above, in a region where the memory array 100, the ECC circuit section 401, and the input/output circuit section 500 are provided, the normal read data RD <127:0>, the normal write data WD <127:0>, the parity read data PRD <7:0>, the parity write data PWD <7:0>, the error flags ERRF <127:0>, and the error-corrected data RO <127:0> are arranged in substantially straight lines and with a shortest distance. The syndrome calculation results SYND <7:0> are arranged so as to have substantially equal wiring loads.

Therefore, delay times between data bits in an ECC process can be caused to be uniform. In addition, data paths with a shortest distance can be formed. Therefore, a process time required for an ECC process can be suppressed. Also, a layout that is divided into bit slices corresponding to respective bits is provided, so that data paths can be formed in substantially straight lines, and therefore, a useless wiring region can be removed. Also, substantially the same layout is provided for each bit, so that device variations during manufacture or the like can be suppressed, resulting in a high yield and stable production.

Note that, in this embodiment, the configurations of the data latch column and the multiplexer column are not particularly limited. As an example, the second multiplexer column 602 may be provided before and after the ECC circuit section 401 as in Variation 4 of Embodiment 1. In this case, the second multiplexer column 602 can be caused to have a small circuit scale as compared to the first data latch column 300 or the first multiplexer column 601. Therefore, the layout of the second multiplexer column 602 can be incorporated into the region of the ECC circuit section 401 or the region of the input/output circuit section 500.

Thus, the layout area can be reduced, corresponding to various circuit configurations, without departing from the purpose of this embodiment.

Variation 1 of Embodiment 2

Figure 14:
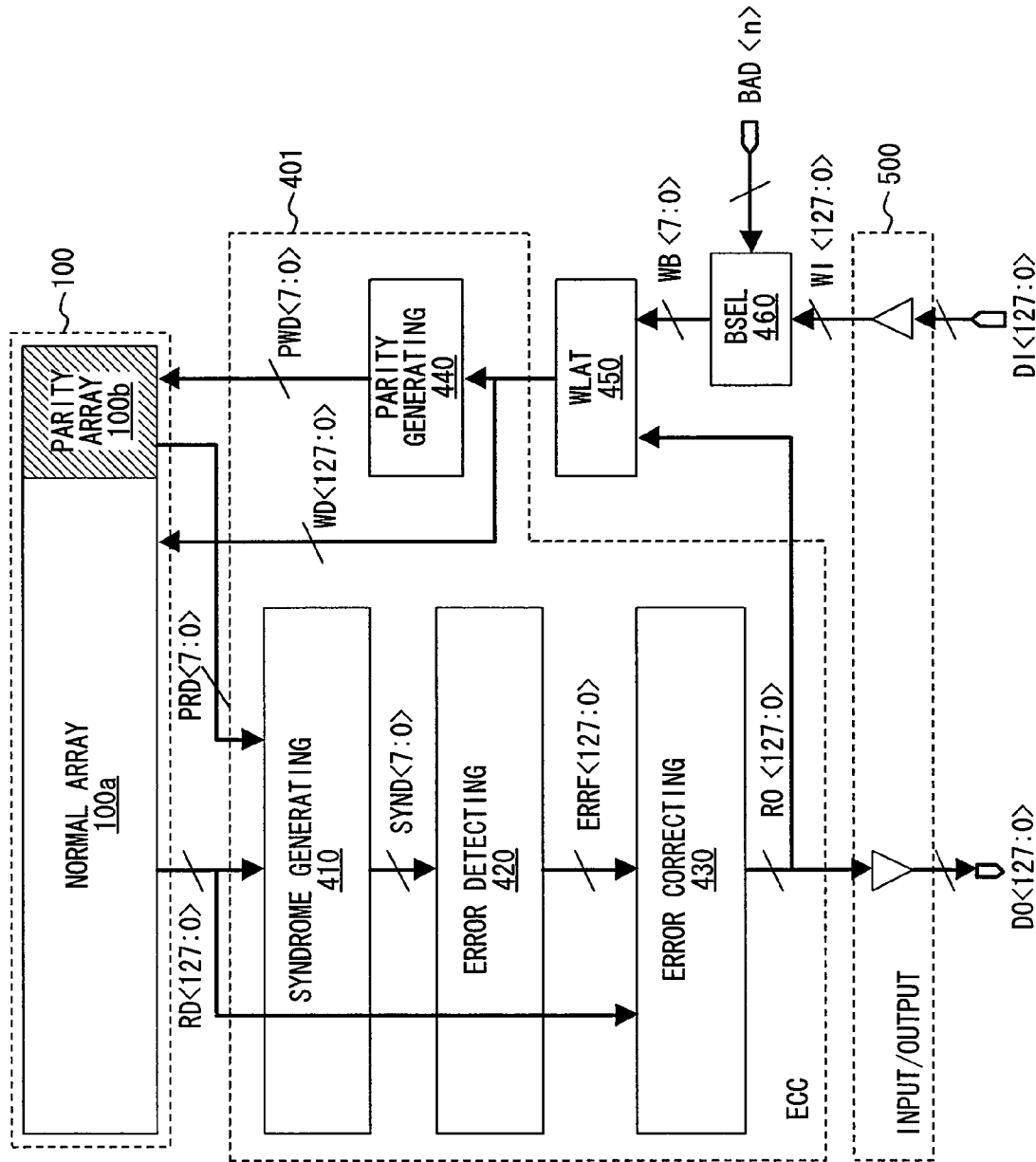
FIG. 14 is a block diagram showing a configuration of an ECC circuit section in a semiconductor storage device according to Variation 1 of Embodiment 2 of the present invention.

FIG. 14 is a diagram showing a block configuration of an ECC circuit section that is applied to a semiconductor storage device according to Variation 1 of Embodiment 2 of the present invention, and a flow of data. FIG. 14 is different from FIG. 8 in that a byte data selecting circuit 460 for selecting and outputting byte write data WB <7:0> from write data WI <127:0> in accordance with a byte address signal BAD <n> and a second data latch column 450 for latching output data RO <127:0> of an error correcting section 430 and the byte write data WB <7:0> are additionally provided.

This embodiment is preferably applied to a semiconductor storage device that can be accessed in bytes or bits. This embodiment is also preferably applied to a case where the number of input/output data bits from/to the outside is small as compared to the number of process bits in an ECC circuit section 401.

Here, access in bytes will be described. A read operation is similar to the operation of Embodiment 2. However, during a write operation, the data RO <127:0> that is input from the memory array 100 to the ECC circuit section 401 and is then subjected to error detection and correction in the ECC circuit section 401, is read out to the second data latch column 450, which in turn latches the data RO <127:0>. On the other hand, of the externally input write data WI <127:0>, WB <7:0> are selected and validated by the byte address signal BAD <n>, and only latch units corresponding to WB <7:0> of the second data latch column 450 are rewritten.

With a configuration as described above, an effect similar to that of Embodiment 2 can be obtained even in a semiconductor storage device having a byte access mode.

Variation 2 of Embodiment 2

Figures 15A, 15B, 15C:
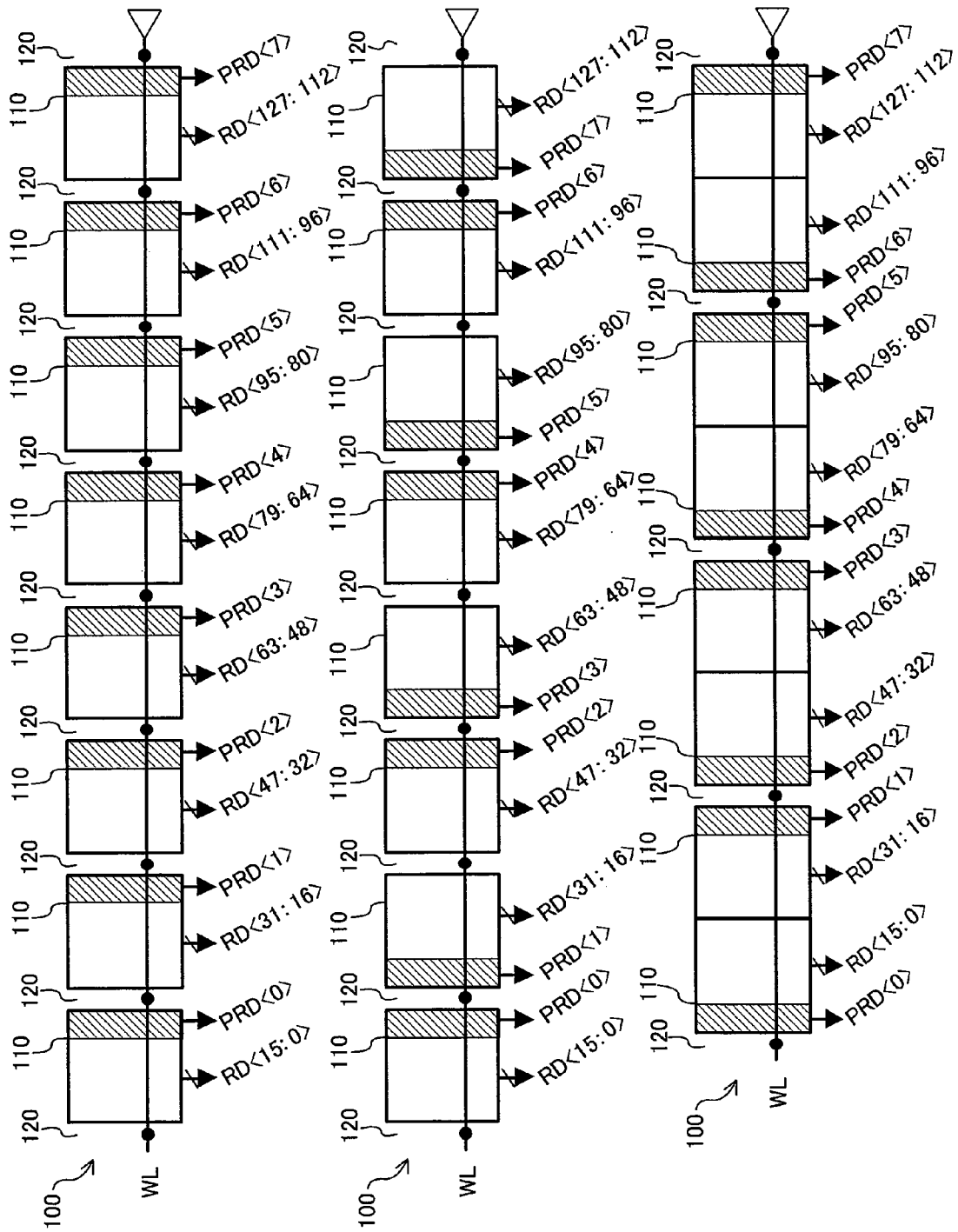
FIGS. 15A, 15B and 15C are diagrams showing layouts of a memory array section according to Embodiment 2.

FIGS. 15A, 15B and 15C are schematic diagrams showing a layout of a memory array 100 in a semiconductor storage device according to Variation 2 of Embodiment 2, where only read data lines are illustrated for the sake of simplicity.

In FIGS. 15A to 15C, sub-memory arrays 110 each include a normal array and a parity array, corresponding to 16-bit normal read data RD <n×16+15:n×16> and 1-bit parity read data PRD <n>, where n is an integer of 0 to 7. Word lines WL are formed of polysilicon. In order to reduce the resistance of the wiring line, a word line shunt region 120 is provided. In this region, a metal wiring line formed in an upper layer and the polysilicon word wiring line are connected together.

In FIG. 15A, eight sub-memory arrays 110 having the same configuration are equally spaced. The word line shunt region 120 is provided between each sub-memory array 110. With this configuration, the wiring resistance of the word line WL is reduced, and the sub-memory arrays 110 have a common configuration, so that the word line WL has a uniform resistance in each sub-memory array 110, and therefore, a uniform memory operation can be achieved. Also, if the parity array is arranged close to the word line shunt region 120, the resistance of the word line WL can be reduced as compared to the normal array. With this configuration, a write time penalty to the parity array can be suppressed, thereby making it possible to improve the whole access performance.

FIG. 15B shows an example in which the arrangement orientation of every other sub-memory array 110 is mirror-reversed. The configuration of each sub-memory array and the arrangement constraints of the parity array are similar to those of FIG. 15A. As described in Embodiment 2, circuit elements involved in an ECC process do not need to be provided in the error detecting section and the error correcting section toward which the parity array extends, so that these sections can be effectively used for the purpose of improving the performance of other circuit blocks and stabilizing an operation. With this configuration, the parity array regions are contiguous with the word line shunt region 120 interposed therebetween, so that these regions have a large area, and therefore, are effectively used as a device arrangement region for the ECC circuit section or the data path circuit section or a region for incorporating a buffering circuit, a test circuit or the like for a control signal or the like.

FIG. 15C shows a configuration in which the number of word line shunt regions 120 is reduced. There are four sets of two sub-memory arrays 110 in each of which two normal arrays are joined together. With this configuration, the number of word line shunt regions 120 can be reduced, resulting in a reduction in chip area.

The configurations of FIGS. 15A to 15C are only for illustrative purposes. Other configurations may be employed as long as the object of the present invention can be achieved. The configurations and arrangement orientations of the sub-memory arrays 110, the number of the word line shunt regions 120, and the like can be combined.

Although a DRAM with a word line shunt technique has been described in this embodiment, a DRAM with a hierarchical word line configuration may be used. A sub-word line driver region corresponds to the above-described word line shunt region 120, and a similar effect can be obtained.

Variation 3 of Embodiment 2

Figure 16:
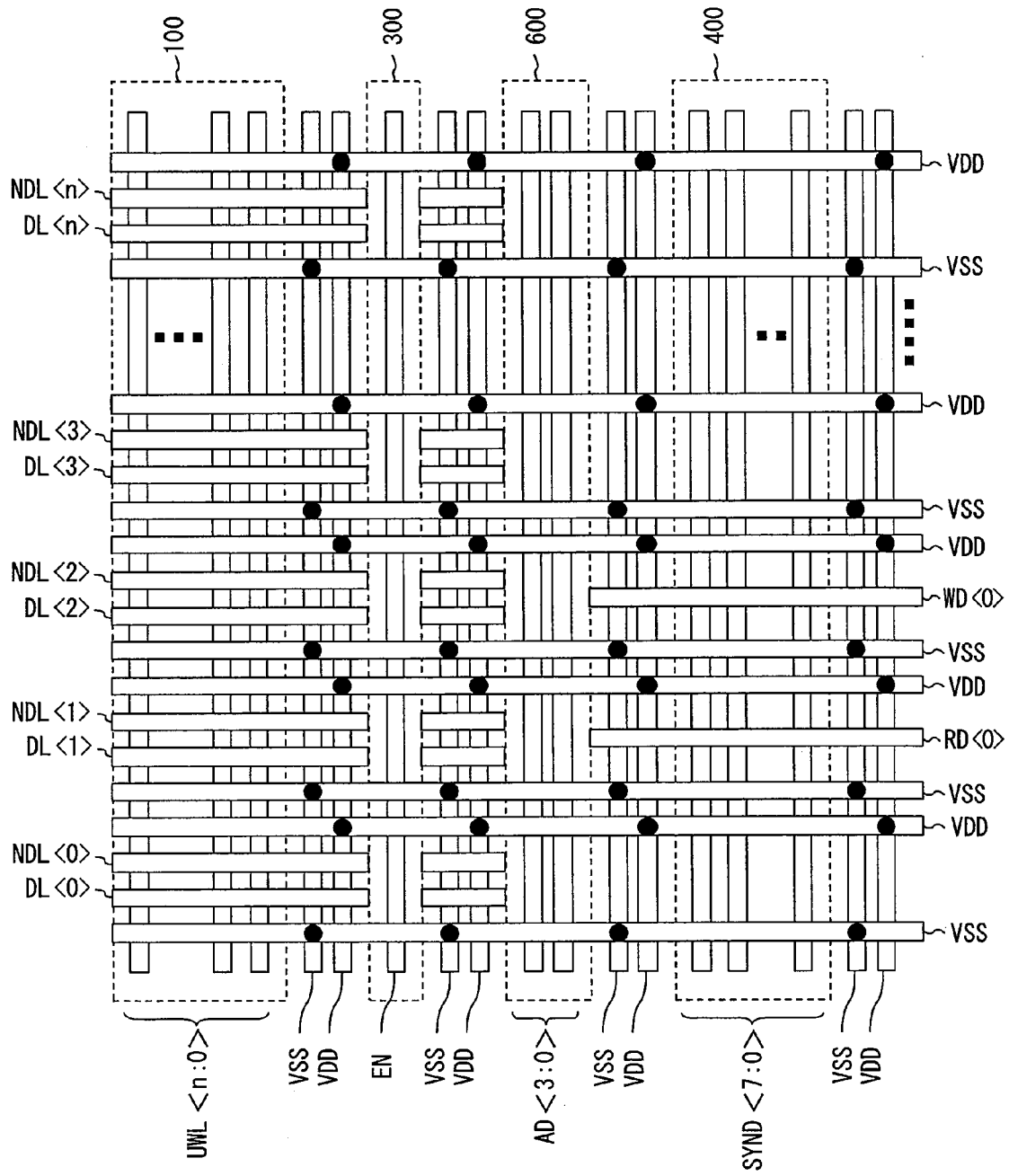
FIG. 16 is a diagram schematically showing a power supply wiring configuration in the semiconductor storage device of Embodiment 2.

FIG. 16 is a schematic diagram showing a power supply wiring configuration in a semiconductor storage device according to Variation 3 of Embodiment 2. In FIG. 16, word line shunt wiring lines UWL <n:0>, a data latch control signal EN, address signals AD <3:0> for controlling selection of a multiplexer, and syndrome signals SYND <7:0> are formed in a first wiring layer in a direction parallel to the word line shunt wiring lines UWL <n:0>. First data lines DL <n:0> and NDL <n:0>, a read data line RD <0>, and a write data line WD <0> are formed in a second wiring layer in a direction orthogonal to the word line shunt wiring lines UWL <n:0>.

A power supply line VDD and a ground line VSS are formed in parallel in the same wiring layer as the first wiring layer, and a power supply line VDD and a ground line VSS are formed in parallel in the same wiring layer as the second wiring layer. The power supply lines VDD and the ground lines VSS in the first wiring layer and the second wiring layer are connected to each other at intersections thereof, respectively, via contact hole, which are thus arranged in a grid.

When the power supply lines VDD and the ground lines VSS are arranged as described above, the wiring resistances of the power supply lines VDD and the ground lines VSS can be reduced and can be caused to be uniform, so that a stable circuit operation can be achieved, in the memory array 100 and the ECC circuit section 400 that simultaneously process a large number of data bits.

The first wiring layer and the second wiring layer may be made of a metal, such as aluminum, copper or the like. The first wiring layer may be provided above the second wiring layer or vice versa.

Embodiment 3

Figure 17:
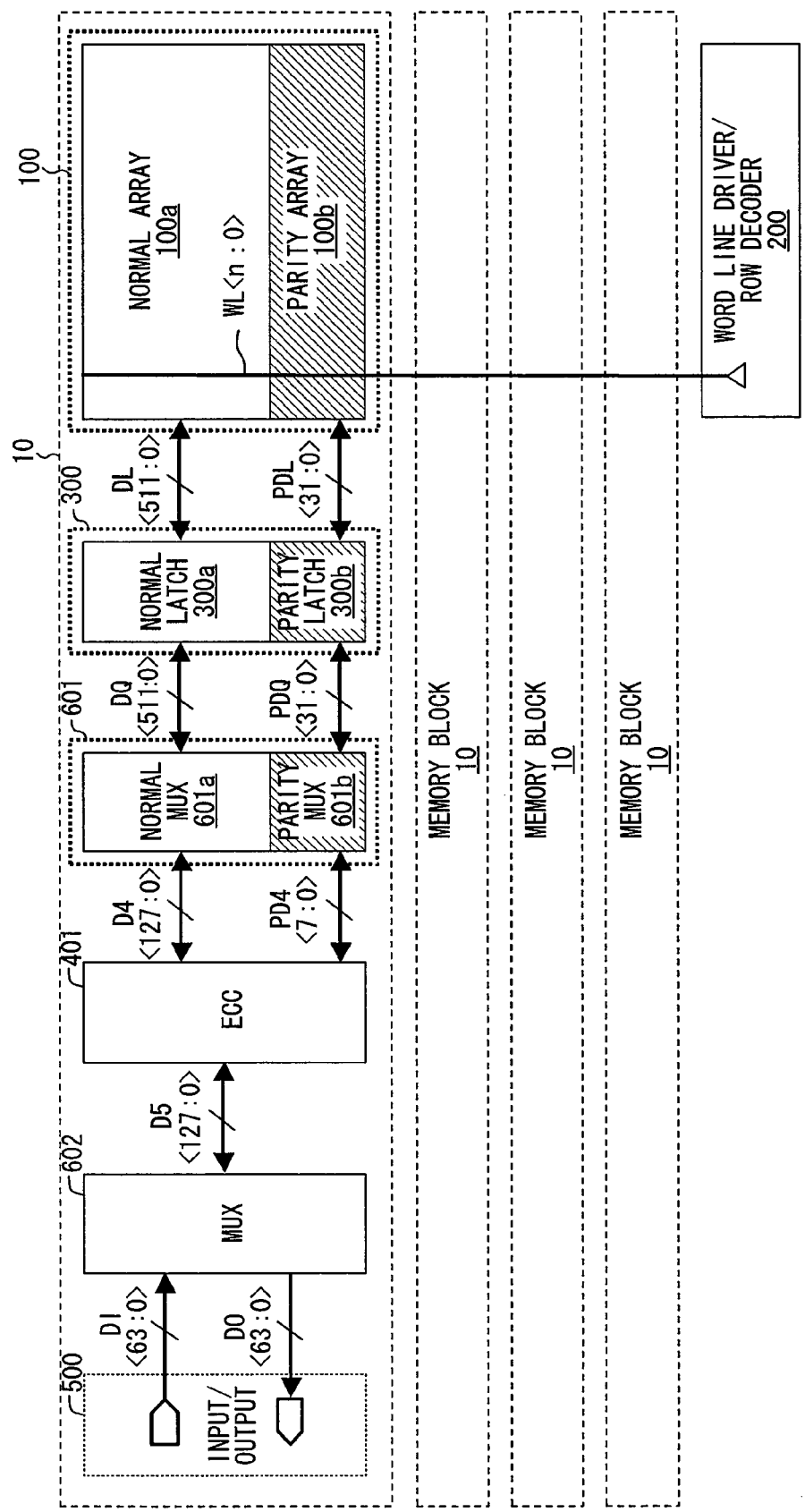
FIG. 17 is a block diagram showing a configuration of a semiconductor storage device according to Embodiment 3 of the present invention.

FIG. 17 is a block diagram showing a configuration of a memory array and an ECC circuit section in a semiconductor storage device according to Embodiment 3 of the present invention. As compared to Variation 4 of Embodiment 1 (see FIG. 5), four memory blocks 10 each including the circuit sections except for the word line driver/row decoder 200 are configured and provided. The memory blocks 10 perform data read and write operations using word lines WL <n:0> with the same access cycle and the same address.

As in this embodiment, a word line driver/row decoder 200 is provided in common to the memory blocks 10. The memory blocks 10 are successively arranged so that the word lines WL <n:0> extending in a straight line can be connected in common thereto. Thereby, the chip area can be reduced. Further, the memory blocks 10 can be simultaneously operated in parallel, so that the number of data bits in the whole device can be easily increased without increasing the number of process bits per ECC circuit. In other words, the number of data bits in the whole device can be easily increased without increasing the number of process gate stages in each ECC circuit. Therefore, it is possible to achieve a semiconductor storage device with an ECC process circuit capable of handling data including a larger number of bits while maintaining the speed performance without increasing the layout area.

Note that the word line drive circuit may be divided, depending on the relationship between the parasitic load of the word lines WL <n:0> and the drive performance of the word line driver/row decoder 200.

Although not illustrated, memory sub-blocks with an ECC function may be provided by providing the word line driver/row decoder 200 for each memory block 10 in one-to-one correspondence. In the case of an SOC memory with an ECC function, a plurality of memory sub-blocks may be provided within a chip, thereby making it possible to improve the flexibility of a chip layout.

Embodiment 4

A redundant relief technique in which a defective cell is replaced with a spare cell in a semiconductor storage device, particularly, a DRAM, is a commonly used technique. Row redundancy in which replacement is performed in word lines and column redundancy in which replacement is performed in bit lines or data lines are generally combined. Replacement is performed in rows for the row redundancy and in columns for the column redundancy.

In recent years, as process techniques have been advanced, line defects due to dust or the like during manufacturing processes are considerably unlikely to occur. Conversely, bit defects due to variations in device dimension, variations in impurity concentration or the like is dominant. In other words, conventional redundant relief techniques are less effective to recent process generations, so that a satisfactory yield is not likely to be obtained.

As described in the embodiments above, the error detection/correction technique employing the Hamming code ECC technique exhibits a bit defect relief effect, so that a bit defect can be corrected in rows, and therefore, the relief flexibility of the redundant relief technique is significantly improved. By avoiding cells, bit lines, and data lines to be simultaneously accessed from being physically adjacent to each other, multi-bit defects to which the ECC technique is less effective can be significantly reduced. Further, the resistance against an irregular defect occurring in use due to a soft error or the like can be significantly improved by incorporating the ECC technique, thereby making it possible to improve the reliability.

As described above, the ECC technique is superior to the redundancy technique in terms of relief of a defective cell. In the ECC technique, however, the chip area is disadvantageously increased by providing parity cells.

When the 128-bit ECC process shown in Variation 4 of Embodiment 1 (see FIG. 5) is applied, 8 parity bits are required, so that the cell area is increased by 6.25%. On the other hand, in the case of the redundancy technique, if the degree of freedom is two, the cell area is increased by 1.56%. If the degree of freedom is four, the cell area is increased by 3.125%. Further, when the redundancy technique is employed, a program circuit for programming replacement addresses is required, so that a laser programmed fuse or an electrically programmed fuse is used. However, the areas of regions where these programmed elements are formed are not negligible. When the ECC technique is employed, the area penalty can be eventually reduced to a negligible level.

In the case of the ECC technique, a one-bit error in 128 bits can be corrected in units of a single word line, for example. In the case of a column redundancy technique where the degree of freedom is two, 2-bit relief can be separately performed in a region corresponding to 256 word lines and 128-bit data, for example. Therefore, the ECC technique has a higher level of relief efficiency. Note that the ECC technique cannot correct a word line defect, or a large block defect that cannot be corrected by any physical arrangement.

Therefore, a semiconductor storage device is configured to include an ECC process circuit and parity cells, and a row-direction redundant relief circuit and spare cells, and exclude a column-direction redundant relief circuit and spare cells. With this configuration, a sufficient manufacture yield and reliability can be secured, and further, the chip area can be reduced.

Figure 18:
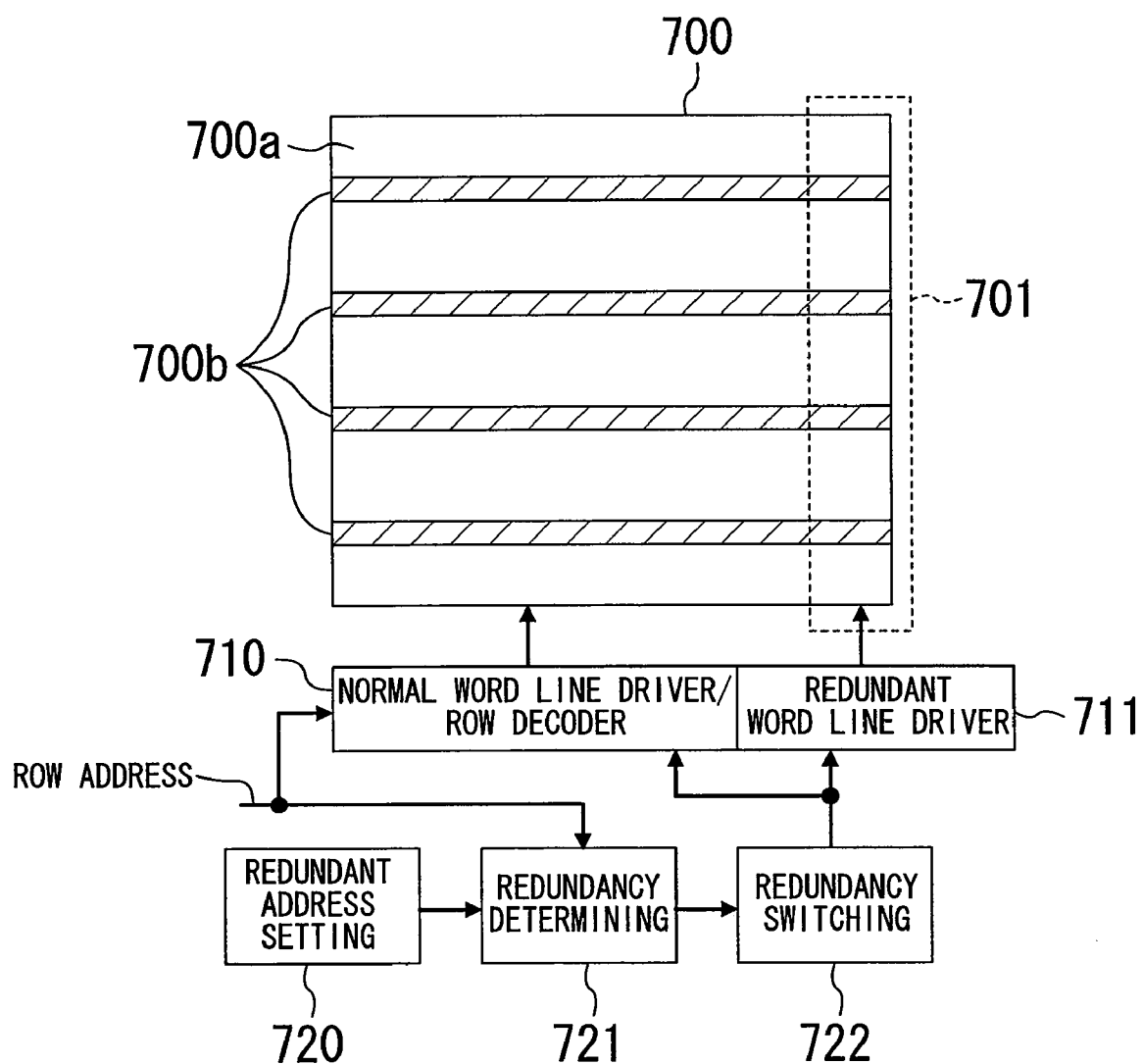
FIG. 18 is a block diagram showing a configuration of a semiconductor storage device according to Embodiment 4 of the present invention.

FIG. 18 is a block diagram showing a configuration of a semiconductor storage device according to Embodiment 4 of the present invention. A memory array 700 of FIG. 18 corresponds to, for example, the memory array 100 of FIG. 2 and includes a normal region 700a and a parity region 700b. The semiconductor storage device of FIG. 18 includes, in addition to the ECC circuit section 400 and the like of FIG. 2, spare word lines 701 for row redundancy, a normal word line driver/row decoder section 710, a redundant word line driver 711, a redundant address setting section 720, a redundancy determining circuit section 721, and a redundancy switching circuit section 722, and excludes spare bit lines for column redundancy.

In the semiconductor storage device of the present invention, more specifically, a semiconductor storage device with an ECC circuit having a self-correction function, the amount of parity cells can be suppressed, and at the same time, the data path system can be arranged so that the chip area can be reduced and the speed of an ECC process can be increased, and in addition, the yield and the reliability can be improved.

What is claimed is:

1. A semiconductor storage device comprising:
   a memory array including a normal array for storing normal data and a parity array for storing parity data for detecting an error in the normal data;
   a plurality of first data lines for writing and reading the memory array;
   a plurality of first data latches to which the plurality of first data lines are connected;
   an ECC circuit section for generating parity data to be stored into the parity array from write data to the normal array, and performing error detection/correction with respect to read data based on normal data and parity data read from the plurality of first data latches;
   an input/output section for interfacing between the ECC circuit section and an outside;
   a plurality of second data lines to which outputs of the plurality of first data latches are connected; and
   a plurality of third data lines to which data that has been error-corrected by the ECC circuit section is connected,
   wherein the plurality of second data lines are input to the ECC circuit section,
   the plurality of third data lines output from the ECC circuit section are connected to the input/output section,
   the plurality of first data latches are arranged in a column, close to the memory array in a direction in which the plurality of first data lines extend,
   the ECC circuit section is arranged close to the plurality of first data latches, and
   the plurality of first data latches and the ECC circuit section are provided substantially within a width in which the memory array is provided.

2. The semiconductor storage device of claim 1, further comprising:
   a plurality of first multiplexers for performing multiplexing in accordance with a first address signal; and
   a plurality of fourth data lines connected to outputs of the plurality of first multiplexers,
   wherein the plurality of first data lines are input to the plurality of first multiplexers,
   the plurality of fourth data lines are connected to the plurality of first data latches, and
   the plurality of first multiplexers are provided in a column between the memory array and the plurality of first data latches.

3. The semiconductor storage device of claim 2, wherein the plurality of first data lines corresponding to the plurality of fourth data lines to be simultaneously selected are arranged so as not to be physically adjacent to each other.

4. The semiconductor storage device of claim 2, further comprising:
   a plurality of second multiplexers for performing multiplexing in accordance with a second address signal; and
   a plurality of fifth data lines connected to outputs of the plurality of second multiplexers,
   wherein the plurality of fifth data lines are connected to the ECC circuit section, and
   the plurality of third data lines are connected to the input/output section.

5. The semiconductor storage device of claim 1, further comprising:
   a plurality of first multiplexers for performing multiplexing in accordance with a first address signal; and
   a plurality of fourth data lines connected to outputs of the plurality of first multiplexers,
   wherein the plurality of second data lines are input to the plurality of first multiplexers,
   the plurality of fourth data lines are connected to the ECC circuit section, and
   the plurality of first multiplexers are arranged in a column between the plurality of first data latches and the ECC circuit section.

6. The semiconductor storage device of claim 5, wherein the plurality of second data lines and the plurality of first data lines corresponding to the plurality of fourth data lines to be simultaneously selected are arranged so as not to be physically adjacent to each other.

7. The semiconductor storage device of claim 5, further comprising:
   a plurality of second multiplexers for performing multiplexing in accordance with a second address signal; and
   a plurality of fifth data lines connected to outputs of the plurality of second multiplexers,
   wherein the plurality of fifth data lines are connected to the ECC circuit section, and
   the plurality of third data lines are connected to the input/output section.

8. The semiconductor storage device of claim 1, further comprising:
   a plurality of second data latches for selectively latching the plurality of third data lines and externally input data.

9. The semiconductor storage device of claim 1, wherein a layout pattern of circuits corresponding to a unit bit that is 1-bit data input to the ECC circuit section is the same and continuous between each unit bit, in a region corresponding to the normal array and a region corresponding to the parity array between the memory array and the ECC circuit section.

10. The semiconductor storage device of claim 1, wherein the plurality of first data latches include at least a read latch circuit, a write buffer circuit and a data line precharging circuit connected to the plurality of first data lines.

11. The semiconductor storage device of claim 10, wherein the plurality of first data lines are bit lines connected to memory cells in the memory array, and the read latch circuit has a sense amplification function of detecting and amplifying a potential of the bit line.

12. The semiconductor storage device of claim 10, wherein the plurality of first data lines are common data lines selectively connected to a plurality of sense amplifiers in the memory array via data line connection switches, and the read latch circuit has a bus amplification function of detecting and amplifying a potential of the common data line.

13. The semiconductor storage device of claim 12, wherein the sense amplifier is connected to a complementary bit line connected in common to a plurality of dynamic memory cells, and data to be simultaneously subjected to an ECC process is arranged, corresponding to the complementary bit lines that are not physically adjacent to each other.

14. The semiconductor storage device of claim 1, wherein latch control signal lines of the plurality of first data latches are provided in a first wiring layer in a direction parallel to a plurality of word line shunt wiring lines in the memory array, and
the plurality of first data lines, the plurality of second data lines, and the plurality of third data lines are provided in a second wiring layer in a direction orthogonal to the word line shunt wiring line.

15. The semiconductor storage device of claim 1, wherein the memory array is divided into a plurality of sub-memory arrays including the normal array and the parity array, and the plurality of sub-memory arrays are arranged in constant pitches.

16. The semiconductor storage device of claim 15, wherein n (n is an integer of one or more) of the sub-memory arrays are included in each of sub-word regions separated by word line shunt regions, and the sub-word regions are arranged in constant pitches.

17. The semiconductor storage device of claim 16, wherein in the sub-word region, the parity array is arranged close to the word line shunt region.

18. The semiconductor storage device of claim 1, wherein the ECC circuit section includes:
 a syndrome generating section for receiving the plurality of first data lines from normal data and parity data read from the memory array, and generating syndrome data;
 an error detecting section for decoding the input syndrome data and detecting the presence or absence of an error, and an error bit;
 an error correcting section for correcting the normal data using output data of the error detecting section; and
 a parity generating section for generating parity data from externally input write data,
 wherein the syndrome generating section, the error detecting section, the error correcting section, and the parity generating section are successively arranged in a direction away from the memory array.

19. The semiconductor storage device of claim 18, wherein input pins of the syndrome generating section are arranged on extensions of the plurality of first data lines, and the extensions have a shortest distance.

20. The semiconductor storage device of claim 18, wherein unit circuits of the error detecting section and unit circuits of the error correcting section each corresponding to a unit bit that is data input to the syndrome generating section, are arranged in an extending direction of the plurality of first data lines.

21. The semiconductor storage device of claim 18, wherein output signal pins of the syndrome generating section are arranged in a vicinity of a middle of the syndrome generating section, and have substantially uniform wiring lengths with respect to the error detecting section.

22. The semiconductor storage device of claim 1, comprising:
 at least the memory array section, the plurality of first data latches, and the ECC circuit section, wherein power supply lines or ground lines are arranged in a grid as a whole.

23. A semiconductor storage device comprising:
 a memory array including a normal array for storing normal data and a parity array for storing parity data for detecting an error in the normal data;
 a plurality of first data lines for writing and reading the memory array;
 a plurality of first data latches to which the plurality of first data lines are connected;
 an ECC circuit section for generating parity data to be stored into the parity array from write data to the normal array, and performing error detection/correction with respect to read data based on normal data and parity data read from the plurality of first data latches;
 an input/output section for interfacing between the ECC circuit section and an outside;
 a plurality of second data lines to which outputs of the plurality of first data latches are connected; and
 a plurality of third data lines to which data that has been error-corrected by the ECC circuit section is connected,
 wherein the plurality of second data lines are input to the ECC circuit section,
 the plurality of third data lines output from the ECC circuit section are connected to the input/output section,
 the plurality of first data latches are arranged in a column, close to the memory array in a direction in which the plurality of first data lines extend,
 the ECC circuit section is arranged close to the plurality of first data latches, and
 the plurality of first data latches and the ECC circuit section constitute a plurality of memory blocks provided substantially within a width in which the memory array is provided, and
 the plurality of memory blocks are operated in parallel in the same address cycle.

24. The semiconductor storage device of claim 23, wherein the number of the plurality of memory blocks is at least two, and the plurality of memory blocks are arranged in a column in an extending direction of a word line, and the word lines of the plurality of memory blocks are connected in common and are driven by a common word line driver.

25. The semiconductor storage device of claim 23, wherein the plurality of memory blocks have the same circuit and layout configurations.

26. A semiconductor storage device comprising:
 a memory array including a normal array for storing normal data and a parity array for storing parity data for detecting an error in the normal data;
 a plurality of first data lines for writing and reading the memory array;
 a plurality of first data latches to which the plurality of first data lines are connected;
 an ECC circuit section for generating parity data to be stored into the parity array from write data to the normal array using a Hamming code, and performing error detection/correction with respect to read data based on normal data and parity data read from the plurality of first data latches; and
 a multiplexing section for reducing the number of the plurality of first data lines by a factor of 1/n (n is a natural number of one or more),
 wherein a spare bit line for redundancy is excluded.

27. The semiconductor storage device of claim 26, comprising:
 a spare word line for redundancy and a row redundancy determining and row redundancy switching circuit.

28. The semiconductor storage device of claim 1, wherein the plurality of first data latches are close to the memory array in a direction orthogonal to a direction in which a word line extends.

29. The semiconductor storage device of claim 26, wherein the memory array consists of the normal array and the parity array.

* * * * *